(12) United States Patent
Sakamoto

(10) Patent No.: US 7,557,637 B2
(45) Date of Patent: Jul. 7, 2009

(54) SEMICONDUCTOR CIRCUIT

(75) Inventor: Kozo Sakamoto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 74 days.

(21) Appl. No.: 11/679,325

(22) Filed: Feb. 27, 2007

(65) Prior Publication Data

US 2007/0216469 A1    Sep. 20, 2007

(30) Foreign Application Priority Data

Mar. 20, 2006  (JP) ............................. 2006-075882
Dec. 26, 2006  (JP) ............................. 2006-348754

(51) Int. Cl.
*G05F 1/00*     (2006.01)
(52) U.S. Cl. .................... 327/519; 327/109; 327/427
(58) Field of Classification Search ............ 315/209 R, 315/291, 307; 327/109, 110, 387, 389, 390, 327/419, 425, 427, 519; 323/265, 271, 282, 323/284, 289
See application file for complete search history.

(56) References Cited

U.S. PATENT DOCUMENTS

| | | | |
|---|---|---|---|
| 6,320,451 B1 * | 11/2001 | Harvey et al. ............... | 327/519 |
| 6,744,300 B2 * | 6/2004 | Taguchi et al. .............. | 327/530 |
| 6,778,001 B2 * | 8/2004 | Mayama et al. ............. | 327/427 |
| 6,781,423 B1 * | 8/2004 | Knoedgen ................... | 327/110 |
| 6,943,611 B2 * | 9/2005 | Braun et al. ................. | 327/430 |
| 7,327,053 B2 | 2/2008 | Eckardt et al. | |
| 7,368,969 B2 * | 5/2008 | Suzuki et al. ............... | 327/333 |
| 2003/0179035 A1 | 9/2003 | Braun et al. | |
| 2005/0040883 A1 * | 2/2005 | Saitoh ........................ | 327/541 |

FOREIGN PATENT DOCUMENTS

| | | |
|---|---|---|
| EP | 1624559 | 2/2006 |
| JP | 07-023570 | 1/1995 |
| JP | 2004-242475 | 8/2004 |
| JP | 2004-304527 | 10/2004 |

* cited by examiner

*Primary Examiner*—David Hung Vu
*Assistant Examiner*—Tung X Le
(74) *Attorney, Agent, or Firm*—Antonelli, Terry, Stout & Kraus, LLP.

(57) ABSTRACT

A semiconductor circuit suitable for normally-on switching elements or switching elements low in threshold voltage. A negative power supply is charged by a high-voltage power supply. A high-voltage switch controls the advisability of applying a voltage to a high-voltage terminal. With deducing the power supply to power switching elements, the high-voltage switch is turned off, and even in the case where the voltage of the controlling circuits of the power switching elements is reduced, the power supply capacitors for the controlling circuits are charged by the high-voltage terminal thereby to operate the controlling circuits. Further, a negative power source voltage generating circuit utilizes the energy charged to the capacitors from output terminals. A voltage terminal is inserted between the high-voltage terminal and a reference voltage terminal. The negative power source voltage generating circuit is interposed between the voltage terminal and a plurality of the output terminals.

37 Claims, 30 Drawing Sheets

FIG. 25A

| | NORMAL OPERATION | | |
|---|---|---|---|
| SW 306 | OFF | ON | OFF |
| SW 327 | OFF | ON | OFF |
| SW 34 | OFF | ON | OFF |
| SW 119 | ON | OFF | ON |
| SW 117 | ON | OFF | ON |

FIG. 25B

| | FAULT | | |
|---|---|---|---|
| SW 306 | OFF | ON | |
| SW 327 | OFF | ON | OFF |
| SW 34 | OFF | ON | OFF |
| SW 119 | ON | OFF | ON |
| SW 117 | ON | OFF | ON |

↑
FAULT

SEMICONDUCTOR CIRCUIT

BACKGROUND OF THE INVENTION

This invention relates to a semiconductor circuit suitable for a normally-on semiconductor switching element turned on even in the case where the gate voltage is zero volt and a normally-off semiconductor switch having a low threshold voltage.

Although a wide band gap semiconductor element of such a material as SiC (carbon silicate), GaN (gallium nitride) or diamond has superior characteristics as a switching element, a typical semiconductor element using this wide band gap semiconductor element such as a junction type FET (hereinafter referred to as JFET), a static induction type transistor (hereinafter referred to as SIT), a metal-semiconductor-field-effect-transistor (hereinafter referred to as MESFET), a heterojunction field effect transistor (hereinafter referred to as HFET), a high electron mobility transistor (hereinafter referred to as HEMT) or an accumulation type FET has a normally-on characteristic with the drain current flowing even when the gate voltage is zero or a normally-off characteristic with a low threshold voltage of not more than 2 to 3 V. A negative power supply circuit for applying a negative voltage between gate and source is required, therefore, to positively turn off the power semiconductor element.

US Patent Application Publication US2003/0179035A1 (FIGS. 3 to 6, and Paragraphs (0025) to (0031)) discloses a method of driving the normally-on JFET, or in particular a controlling circuit in which the gate current can be suppressed at a low level for a JFET having a different breakdown voltage of the diode between gate and source. Also, JP-A-2004-304527 (FIG. 1, and Paragraphs (0015) and (0016)) discloses the conventional bootstrap circuit in which a power supply capacitor of an upper-arm switching element is charged through a lower-arm switching element. Further, JP-A-2004-304527 discloses a method of charging the power supply capacitor of each upper-arm switching element from an auxiliary capacitor used with three sets of charge-discharge switching elements. JP-A-7-23570 (FIGS. 1, 2, and Paragraph (0006)), on the other hand, discloses a SIT activation circuit with a suppressed inrush current in which the gate voltage and the source voltage are applied at different timings for stable activation of the SIT providing a normally-on transistor.

Also, JP-A-2004-242475 (Paragraphs (0034) to (0044)) discloses a circuit having a normally-on FET in which the negative side of a first DC power supply constituting a main power supply is connected with a second DC power supply with the voltage established at the same time as the first DC power supply, and the arm shorting is avoided utilizing the second DC power supply.

The prior art described in US Patent Application Publication US2003/0179035A1 fails to take into consideration a configuration in which a capacitor is used as a power supply for the negative gate voltage of the controlling circuit and charged by the source current of a power semiconductor element.

The prior art described in JP-A-2004-304527, on the other hand, lacks the study of a method to charge the power supply capacitor of the upper-arm switching element through the upper-arm switching element. Further, JP-A-2004-304527, in spite of the study being made about charging the power supply capacitor of the upper-arm switching element from an auxiliary capacitor using three sets of charge-discharge switching elements and auxiliary capacitors, fails to study the method of reducing the number of the charge-discharge capacitors. Also, the use of the power supply capacitor arranged on the lower-arm semiconductor element as a power supply is not studied.

The prior art of JP-A-7-23570 discloses a SIT activation circuit in which the gate voltage and the source voltage are applied at different timings to stably activate the SIT providing a normally-on transistor. Nevertheless, the study is not made about turning off the switching element in collaboration between the switch circuit and a protective circuit and the manner in which the switching element is turned off.

The conventional circuit described in JP-A-2004-242475, in spite of the disclosure of the method of shorting the arm using a second DC power supply, fails to study a case in which the second DC power supply ceases to work.

SUMMARY OF THE INVENTION

The object of this invention is to provide a semiconductor circuit suitable for a normally-on semiconductor switching element turned on even in the case where the gate voltage is zero and a normally-off semiconductor switch low in threshold voltage.

According to one aspect of the invention, there is provided a semiconductor circuit including a negative power source voltage generating circuit utilizing the energy charged to a capacitor from the output terminal to reduce the number of power supplies for the controlling circuits. Further, according to this aspect of the invention, a voltage terminal is interposed between a high-voltage terminal and a reference voltage terminal and a negative power source voltage generating circuit is arranged between the voltage terminal and a plurality of output terminals.

According to another aspect of the invention, there is provided a semiconductor circuit including a high-voltage switch for controlling the advisability of applying a voltage to the high-voltage terminal, wherein even in the case where the high-voltage switch is turned off or the voltage for the controlling circuit of the power switching element drops with the reduction in the power supplied to the power switching element, the controlling circuit is operated by charging the power supply capacitor for the controlling circuit from the high-voltage terminal, thereby preventing an excessively large current from being supplied to the power switching element. As an alternative, in the case where the power supplied to the power supply of the controlling circuit of the power switching element is reduced, the gate voltage of the power switching element is automatically decreased to prevent an excessive current from flowing in the power switching element.

According to still another aspect of the invention, there is provided a semiconductor circuit, wherein in the case where the power supplied from the power supply for the controlling circuit of the power switching element is reduced, a current path is formed to reduce the voltage of the high-voltage terminal. Also, in order to reduce the power consumption of the controlling circuit of the power switching element, a switch to turn off the current to a logic controlling circuit unit in the controlling circuit is inserted in the case where the logic controlling circuit unit is not required to be operated. Further, in order to reduce the ratio dV/dt of the output voltage while preventing the output terminal voltage from considerably deviating from the voltage range of the voltage of the high-voltage terminal and the voltage at the reference voltage terminal at the time of rapid switching operation, a capacitor adapted for charge or discharge operation only in the neighborhood of the voltage of the high-voltage terminal and the voltage of the reference voltage terminal is connected to the output terminal.

According to yet another aspect of the invention, there is provided a semiconductor circuit including a negative power supply for turning off the normally-on switching element positively, wherein the negative power is supplied by power conversion from the positive power supply. Depending on the prevailing situation, on the other hand, the negative power can be supplied from the negative power supply to the positive power supply by power conversion.

According to a further aspect of the invention, there is provided a semiconductor circuit, wherein the load connected to the body of an automotive vehicle, for example, is supplied with the power also from a load power supply having a high-voltage terminal connected to a load reference voltage terminal.

According to this invention, the controlling circuit of the normally-on switching element or the normally-off switching element having a low threshold voltage can be simplified and the semiconductor circuit reduced in size while at the same time improving the reliability. Also, the circuit configuration according to the invention realizes a low-loss, high-speed soft switching operation.

BRIEF DESCRIPTION OF THE DRAWINGS

FIGS. 25A and 25B are diagrams for explaining a semiconductor circuit according to a 25th embodiment.

DETAILED DESCRIPTION OF THE INVENTION

Figure 1:
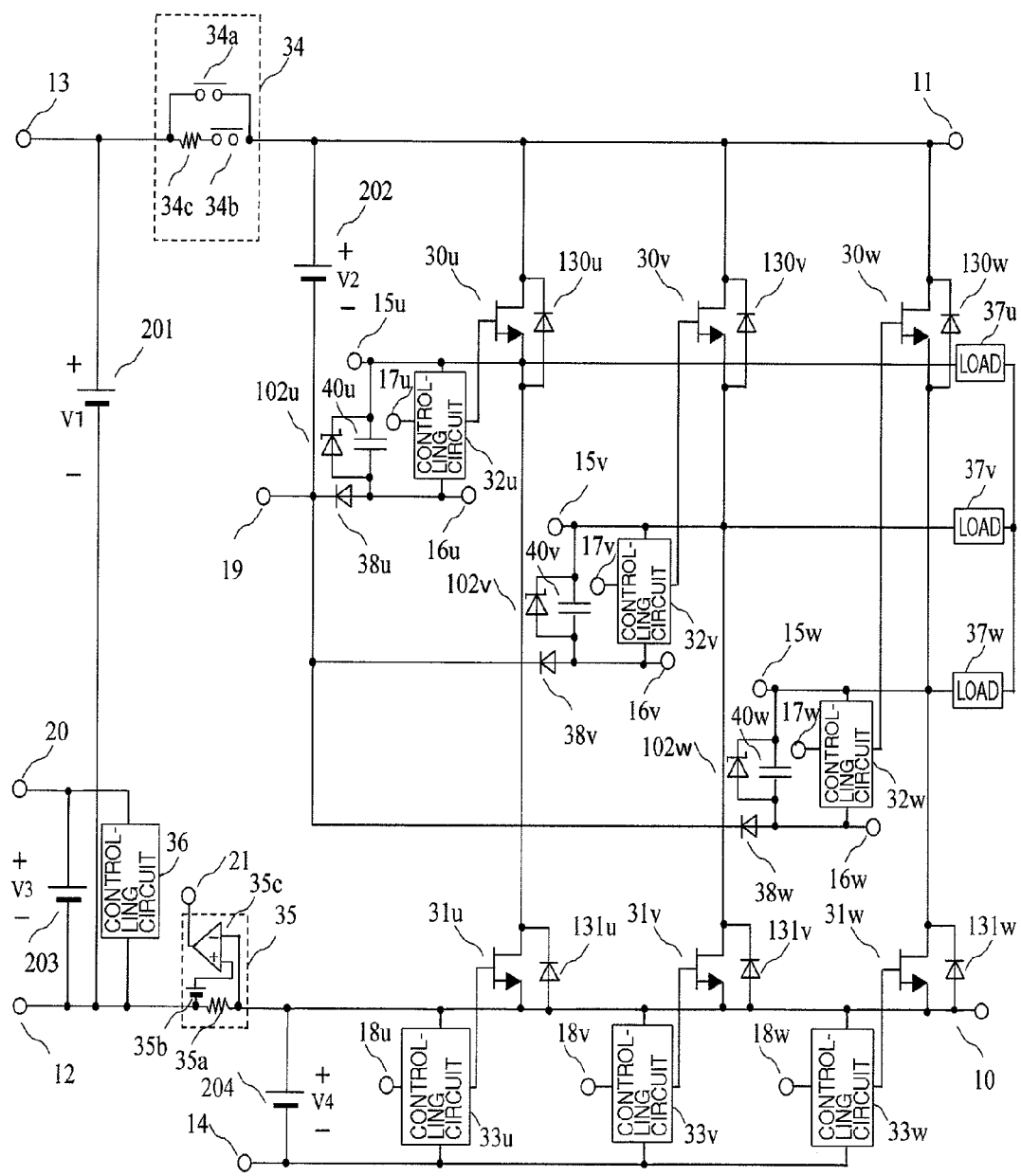
FIG. 1 is a diagram for explaining a semiconductor circuit according to a first embodiment.

In the semiconductor circuit according to this invention, between a reference voltage terminal 10 and a high-voltage terminal 11 providing a first power source voltage terminal higher in voltage than the reference voltage terminal 10, first switching elements $30u$, $30v$, $30w$ and first controlling circuits $32u$, $32v$, $32w$ for controlling the first switching elements $30u$, $30v$, $30w$ are inserted between at least one output terminal and a first power source voltage terminal. The first controlling circuits $32u$, $32v$, $32w$ are operated between high-voltage-side voltage terminals $15u$, $15v$, $15w$, $9u$, $9v$, $9w$ and low-voltage-side voltage terminals $16u$, $16v$, $16w$, respectively. The voltage of the low-voltage-side voltage terminals $16u$, $16v$, $16w$ is a negative voltage lower than the voltage of the source terminal of the first switching elements. First capacitors $40u$, $40v$, $40w$ are inserted between the high-voltage-side voltage terminals $15u$, $15v$, $15w$ providing output terminals and a second source voltage terminal 19. The voltage of the low-voltage-side voltage terminals $16u$, $16v$, $16w$ is generated by the voltage charged to the first capacitors $40u$, $40v$, $40w$. Further, first diodes $38u$, $38v$, $38w$ are inserted between the second power source voltage terminal 19 and the first capacitors $40u$, $40v$, $40w$, respectively. Once the output terminal voltage exceeds the voltage of the second power source voltage terminal 19, the first capacitors are charged, while in the case where the output terminal voltage drops below the voltage of the second power source voltage terminal 19, the first capacitors are prevented from being discharged easily.

Also, in the semiconductor circuit according to this embodiment, diodes $68u$, $68v$, $68w$ constituting rectifying elements are inserted between the first capacitors $40u$, $40v$, $40w$ and a third voltage terminal 14. The lower-arm second capacitors are charged from the first capacitors through the rectifying elements, and thus used as a power supply for controlling the normally-on switching elements and the normally-off switching elements low in threshold voltage. With this circuit configuration, the output terminal voltage is prevented from deviating considerably from the voltage range of the high-voltage terminal and the reference voltage terminal even by the rapid switching operation, thereby making possible "the soft switching operation" in which the ratio dV/dt of the output voltage drops only in the neighborhood of the high-voltage terminal or the reference voltage terminal. Thus, both the switching loss and noises can be reduced for a lower design breakdown voltage of the switching elements.

In the semiconductor circuit according to the invention, the first controlling circuits operate between the high-voltage-side voltage terminals 15u, 15v, 15w; 9u, 9v, 9w and the low-voltage-side voltage terminals 16u, 16v, 16w away in the negative direction of the second voltage. In the first controlling circuits, the voltage of the low-voltage-side voltage terminals 16u, 16v, 16w is a negative voltage lower than the voltage of the high-voltage-side voltage terminals 15u, 15v, 15w providing the source terminals of the first switching elements, respectively. The voltage is increased by turning on the first switch of the first voltage terminal, and in the case where the ability to supply power to the controlling circuits is liable to decrease below the reference value, the first switch is rapidly turned off, and further, the fifth switching element 117 (FIG. 4) connected to the gate terminals of the first switching elements or the sixth switching element 117 (FIG. 16) connected to the low-voltage-side voltage terminals 16u, 16v, 16w is turned on thereby to suppress the drop of the power source voltage of the first controlling circuits 32u, 32v, 32w. As an alternative, the first switching elements 30u, 30v, 30w are turned off regardless of the drive signal thereby to prevent an excessive current from flowing in the first switching elements 30u, 30v, 30w.

The semiconductor circuit according to this invention comprises a reference voltage terminal 12, a first power source voltage terminal higher in voltage than the reference voltage terminal 10, at least a set of output terminals 15u, 15v, 15w arranged between the reference voltage terminal 12 and the first power source voltage terminal 11, second switching elements 31u, 31v, 31w arranged between the reference voltage terminal 10 and the output terminals 15u, 15v, 15w and second controlling circuits 32u, 32v, 32w for controlling the second switching elements 31u, 31v, 31w, respectively, wherein the second controlling circuits 33u, 33v, 33w operate between the voltage of the high-voltage terminal 10 and the voltage of the low-voltage terminal 14. The voltage of the low-voltage terminal 14 is a negative voltage lower than the voltage of the source terminal 10 of the second switching elements, a first power supply 201 is arranged between the reference voltage terminal 10 and the first power source voltage terminal 13, a fifth power supply terminal 14 opposite in polarity to the first power source voltage terminal 11 is inserted in addition to the reference voltage terminal 10, and a normally-off switch 34 turned on when the voltage between the reference voltage terminal 10 and the low-voltage terminal 14 of the second controlling circuits assumes a specified value is inserted between the first power source voltage terminal 11 and the first power supply 201. The voltage at the low-voltage terminal 14 of the second controlling circuits is generated by the fifth power supply 204.

According to this invention, power can be supplied to a load 307 connected to the reference voltage terminal 10 from the fifth power supply 204 providing a negative power supply.

Embodiments of the invention are explained in detail below with reference to the drawings. The embodiments described below refer to a n-channel field-effect switching element. A similar configuration can of course be realized for a p-channel field-effect switching element by reversing the polarity of the circuit with equal effect. Although terminals of the switching element are named as drain, gate, source like FET, the names of collector, base and emitter are used in the case where the switching element is a bipolar transistor.

Embodiment 1

FIG. 1 is a diagram for explaining a semiconductor circuit according to a first embodiment. This embodiment represents a circuit using a n-channel JFET for the upper-arm switching elements 30u, 30v, 30w and the lower-arm switching elements 31u, 31v, 31w. Nevertheless, field-effect switching elements or a bipolar transistor other than JFET such as SIT, MESFET, HFET, HEMT or accumulation type FET may be used with equal effect. This embodiment is explained taking the normally-on switching elements 30u, 30v, 30w, 31u, 31v, 31w as an example.

This embodiment represents a three-phase inverter configured of a bridge circuit wherein the upper-arm switching elements 30u, 30v, 30w are connected between the high-voltage terminal 11 and the high-voltage-side voltage terminals 15u, 15v, 15w providing output terminals, the lower-arm switching elements 31u, 31v, 31w are arranged between the high-voltage-side voltage terminals 15u, 15v, 15w providing output terminals and the reference voltage terminal 10, and loads 37u, 37v, 37w such as motors with the power thereof controlled by the upper-arm switching elements 30u, 30v, 30w and the lower-arm switching elements 31u, 31v, 31w are connected to the high-voltage-side voltage terminals 15u, 15v, 15w providing output terminals. The upper-arm switching elements 30u, 30v, 30w are controlled by the upper-arm controlling circuits 32u, 32v, 32w, and the lower-arm switching elements 31u, 31v, 31w are controlled by the lower-arm controlling circuits 33u, 33v, 33w.

In FIG. 1, reference numerals 130u, 130v, 130w, 131u, 131v, 131w designate flywheel diodes for supplying a current to the drain terminal from the source terminal to the drain terminal of the switching elements in the case of an inductive load. In the case where the switching elements 30u, 30v, 30w, 31u, 31v, 31w are FETs such as JFETs or power MOSFETs or bipolar transistors, the current can be supplied from the source terminal (emitter terminal) to the drain terminal (collector terminal). The flywheel diodes may not be connected, therefore, in the case where the loss is small for supplying the current from the source terminal (emitter terminal) to the drain terminal (collector terminal).

In the case where the diodes 130u, 130v, 130w, 131u, 131v, 131w are not used, the loss is reduced by turning on the switching elements 30u, 30v, 30w, 31u, 31v, 31w as long as the current flows from the source terminal (emitter terminal) to the drain terminal (collector terminal).

According to this embodiment, the high-voltage-side voltage terminals of the upper-arm controlling circuits 32u, 32v, 32w are connected to the high-voltage-side voltage terminals 15u, 15v, 15w, respectively, providing the same output terminals as the source terminal of the switching elements 30u, 30v, 30w, and the low-voltage-side voltage terminals are designated by numerals 16u, 16v, 16w. Also, the high-voltage-side voltage terminals of the lower-arm controlling circuits are connected to the reference voltage terminal 10 like the source terminal of the lower-arm switching elements, and the low-voltage-side voltage terminals of the lower-arm controlling circuits are designated by numeral 14 in FIG. 1.

The power supplies 201, 202, 203, 204 may be either the secondary cells such as the lead battery or the lithium ion battery or the switching power supply or the DC power supply obtained from the secondary output of the transformer. Also, though not shown, a switch may be arranged in series with the power supplies 201, 202, 203, 204 for on/off control of the power supply to save power consumption.

In order to activate this circuit, while the high-voltage switch 34 is in off state, a high voltage V1 is applied between the input-side high-voltage terminal 13 and the input-side reference voltage terminal 12 from the power supply 201, a voltage V2 is applied between the high-voltage terminal 11 and the power source voltage terminal 19 from the power supply 202, a voltage V3 is applied between the terminal 20 and the input-side reference voltage terminal 12 from the power supply 203 and a voltage V4 is applied between the reference voltage terminal 10 and the input-side reference voltage terminal 12 from the power supply 204. In the process, the upper-arm switching elements 30$u$, 30$v$, 30$w$ are impressed with the on-drive signal, while the lower-arm switching elements 31$u$, 31$v$, 31$w$ are impressed with an off-drive signal. Then, the current is supplied to the upper-arm switching elements 30$u$, 30$v$, 30$w$ and the capacitors 40$u$, 40$v$, 40$w$ used as power supplies of the controlling circuits 33$u$, 33$v$, 33$w$ are charged.

Also, the lower-arm switching elements 31$u$, 31$v$, 31$w$ are activated by the power supply 204 thereby to activate the lower-arm controlling circuits 33$u$, 33$v$, 33$w$. In this way, the high-voltage switch 34 is turned on while turning off the upper-arm switching elements 30$u$, 30$v$, 30$w$ and the lower-arm switching elements 31$u$, 31$v$, 31$w$. In order to turn on the high-voltage switch 34, only the switch 34$b$ is turned on initially to prevent an excessive inrush current from flowing in the high-voltage terminal 11, and then the voltage of the high-voltage terminal 11 is slowly increased, after which the switch 34$a$ is turned on. Incidentally, in view of the fact that the capacitors 40$u$, 40$v$, 40$w$ used as a power supply of the upper-arm switching elements 30$u$, 30$v$, 30$w$ are gradually discharged by the current flowing in the controlling circuits 32$u$, 32$v$, 32, it soon becomes impossible to completely turn off the upper-arm switching elements 30$u$, 30$v$, 30$w$. As long as the upper-arm switching elements 30$u$, 30$v$, 30$w$ are slightly turned on, however, the voltage of the high-voltage-side voltage terminals 15$u$, 15$v$, 15$w$ providing output terminals increases, and the capacitors 40$u$, 40$v$, 40$w$ are charged by the power supply 202 thereby to turn of the upper-arm switching elements 30$u$, 30$v$, 30$w$.

Specifically, in the circuit according to this embodiment, in the standby state where all the upper-arm switching elements 30$u$, 30$v$, 30$w$ and the lower-arm switching elements 31$u$, 31$v$, 31$w$ are turned off, the output terminal voltage is at least one third higher than the voltage difference between the high-voltage terminal 11 and the reference voltage terminal 10, and therefore, substantially no current is supplied to the loads 37$u$, 37$v$, 37$w$.

Also, this control method can prevent the through current from flowing from the high-voltage terminal 11 to the reference voltage terminal 10.

As an alternative, first at the time of activation, the upper-arm switching elements 30$u$, 30$v$, 30$w$ are impressed with an on signal, and after the power source voltage of the controlling circuits 32$u$, 32$v$, 32 of the upper-arm switching elements 30$u$, 30$v$, 30$w$ is set to substantially the same value as the power supply 202, all the upper-arm switching elements 30$u$, 30$v$, 30$w$ and the lower-arm switching elements 31$u$, 31$v$, 31$w$ are turned off. Then, in this state, the high-voltage switch 34 may be turned on.

In the case where the wide band gap semiconductor elements of such a material as SiC, GaN or diamond are used as the switching elements 30$u$, 30$v$, 30$w$, 31$u$, 31$v$, 31$w$, the through current can be allowed to flow for a short length of time in the reference voltage terminal 10 from the high-voltage terminal 11. Therefore, it is difficult to control the timing of turning on the high-voltage switch 34. Also, though not shown in FIG. 1, a control signal can be transmitted from the controlling circuit 36 to the controlling circuits 32$u$, 32$v$, 32$w$ and the controlling circuits 33$u$, 33$v$, 33$w$ through a level shift circuit such as a photocoupler.

The voltage across the power supply capacitors 40$u$, 40$v$, 40$w$ for the upper-arm switching elements 30$u$, 30$v$, 30$w$ drops since they supply the current to the controlling circuits 32$u$, 32$v$, 32$w$. Each time the upper-arm switching elements 30$u$, 30$v$, 30$w$ turn on and the potential of the high-voltage-side voltage terminals 15$u$, 15$v$, 15$w$ providing the output terminals increases, however, the power supply capacitors 40$u$, 40$v$, 40$w$ are charged thereby to increase the terminal voltage thereof.

Incidentally, in order to charge the power supply capacitors 40$u$, 40$v$, 40$w$ acting as a power supply of the upper-arm controlling circuits 32$u$, 32$v$, 32$w$, the upper-arm switching elements 30$u$, 30$v$, 30$w$ are required to be turned on. In the standby state where the current is not supplied to the load, therefore, the upper-arm switching elements 30$u$, 30$v$, 30$w$ and the lower-arm switching elements 31$u$, 31$v$, 31$w$ are all turned off. In order to fix the value of the power source voltage of the upper-arm controlling circuits 32$u$, 32$v$, 32$w$, however, all the upper-arm switching elements 30$u$, 30$v$, 30$w$ and the lower-arm switching elements 31$u$, 31$v$, 31$w$ may be turned off while the high-voltage-side voltage terminals 15$u$, 15$v$, 15$w$ providing output terminals may be kept at a high potential. As an alternative, the state in which all the upper-arm switching elements 30$u$, 30$v$, 30$w$ are on and all the lower-arm switching elements 31$u$, 31$v$, 31$w$ are off may alternate with the state in which all the upper-arm switching elements 30$u$, 30$v$, 30$w$ are off and all the lower-arm switching elements 31$u$, 31$v$, 31$w$ are on, so that the power supply capacitors 40$u$, 40$v$, 40$w$ may be kept charged to the desired voltage.

In the case where at least one of the power source voltage of the input power supply 203 for sending a drive signal to the upper-arm controlling circuits 32$u$, 32$v$, 32$w$ and the lower-arm controlling circuits 33$u$, 33$v$, 33$w$. the power source voltage of the upper-arm controlling circuits 32$u$, 32$v$, 32$w$ and the power source voltage of the lower-arm controlling circuits 33$u$, 33$v$, 33$w$ falls below a specified level, the high-voltage switch 34 is desirably turned off. As an alternative, however, the circuit may be simplified in such a manner that at least one of the power source voltages of the power supplies 203, 202, 204 is monitored, and if it drops below the specified value, the high-voltage switch 34 is turned off.

A current detecting circuit 35 compares the voltage drop across a resistor 35$a$ with a reference voltage 35$b$ and thus monitors whether the current not lower than the specified value is flowing from the input high-voltage terminal 13 to the input reference voltage terminal 12. In the case where the current not lower than the reference value flows, a signal for turning off the upper-arm switching elements 30$u$, 30$v$, 30$w$ and the lower-arm switching elements 31$u$, 31$v$, 31$w$ is output to the current detection output terminal 21. In the case where the current not lower than the specified value continues to flow from the input high-voltage terminal 13 to the input reference voltage terminal 12 in spite of the fact that all the upper-arm switching elements 30$u$, 30$v$, 30$w$ and the lower-arm switching elements 31$u$, 31$v$, 31$w$ are turned off, on the other hand, the power source voltage of the controlling circuits may be in shortage or the switching elements may have broken down. In such a case, therefore, the high-voltage switch 34 is rapidly turned off.

In order to turn off the high-voltage switch 34 rapidly, the switches 34$a$ and 34$b$ are turned off at the same time. As an alternative, the switch 34a is first turned off rapidly thereby to increase the impedance of the high-voltage switch 34 and rapidly reduce the current supplied to the load. Specifically, the time required to turn off or increase the impedance of the high-voltage switch 34 is reduced to at least one half of the time required to turn on the high-voltage switch 34.

A flag alarming that an overcurrent has flowed is sent to the controlling circuit 36 and the operation is transferred to stop the inverter. In this way, the switching elements and the whole system are protected from breakdown.

Though not shown, the control signal from the current detecting circuit 35 is transmitted to the controlling circuits 32u, 32v, 32w, the controlling circuits 33u, 33v, 33w, the switching elements 30u, 30v, 30w and the controlling circuit 36 through a level shift circuit such as a photocoupler.

In order to reduce the number of on/off operations of the high-voltage switch 34, on the other hand, a plurality of current comparator circuits (only one of which is shown in FIG. 1) having different reference voltages may be included so that the overcurrent level to turn off the high-voltage switch 34 may be set higher than the overcurrent level to turn off the switching elements 30u, 30v, 30w, 31u, 31v, 31w.

According to this embodiment, the negative power supply circuit for turning off the normally-on switching elements can be realized with a simple circuit configuration. Also, a floating negative power supply for three phases of the upper-arm switching elements can be generated with a single power supply 202, and therefore, the power supply can be reduced in size. Further, in the case where the floating power supply is used, the high-voltage side wire and the low-voltage side wire are required to be extended to the controlling circuits 32u, 32v, 32w. According to this embodiment, however, only one low-voltage side wire may be extended from the power source voltage terminal 19 to the controlling circuits 32u, 32v, 32w, and therefore, the wiring length can be shortened as a whole and the circuit board can be reduced in size.

Also, according to this embodiment, in order to obtain the voltage of the power source voltage terminal 19, the power supply 202 is connected not to the low-voltage side such as the reference voltage terminal 10 or the input-side reference voltage terminal 12 but to the high-voltage terminal 11. Thus, the voltage V2 of the power supply 202 is comparatively low. As a result, the controlling circuits 32u, 32v, 32w can be driven with smaller power. The power supply 202, though connected to the high-voltage terminal 11 according to this embodiment, may alternatively be connected to the input-side high-voltage terminal 13 with a switch connected in series to the power supply 202.

In a special case where the high-voltage side overshoot of the output terminal is large due to the parasitic impedance of the wiring, etc. and too large to generate the power source voltage of the upper-arm controlling circuits, the power source voltage terminal 19 and the terminal 11 may be integrated or the voltage of the power source voltage terminal 19 may be set to a potential higher than that of the high-voltage terminal 11.

In driving the normally-on element, assume that the voltage ceases to be applied to the controlling circuits due to a power failure, etc. Neither the upper-arm switching elements nor the lower-arm switching elements can be turned off, and an overcurrent may flow between the high-voltage terminal 11 and the reference voltage terminal 10. According to this embodiment, however, the high-voltage switch 34 is turned off rapidly to turn off or suppress the current to the high-voltage terminal 11 in the case where the voltage of the power supply 203 or 204 for the controlling circuits drops. As a result, even in the case where the switching elements lose the turn-off ability, power supply to the load can be stopped.

Thus, the elements and the circuit system are protected from a fault which otherwise might be caused by an overcurrent flowing between the high-voltage terminal 11 and the reference voltage terminal 10 or the sustained state of the particular phenomenon. Desirably, the high-voltage switch is turned on in the case where the voltage of the power supply 203, 204 for the controlling circuits is not lower than the first reference voltage value, and once the voltage of the power supply 203, 204 falls to or below the second reference value lower than the first reference voltage value, the high-voltage switch is turned off. As a result, the unstable operation in the neighborhood of the reference voltage for turning on the high-voltage switch can be prevented.

The high-voltage switch 34 is desirably formed of a semiconductor switch high in operating speed. In the case where the upper-arm switching elements and the lower-arm switching elements are Si semiconductor elements, however, the load shorting strength is not higher than 100 μs, and therefore, the mechanical relay cannot provide sufficient protection. With the JFET using a wide band gap semiconductor such as SiC which has the load shorting strength of not smaller than several milliseconds, in contrast, the use of a high-speed mechanical relay as the high-voltage switch 34 can protect against a power failure.

Embodiment 2

Figure 2:
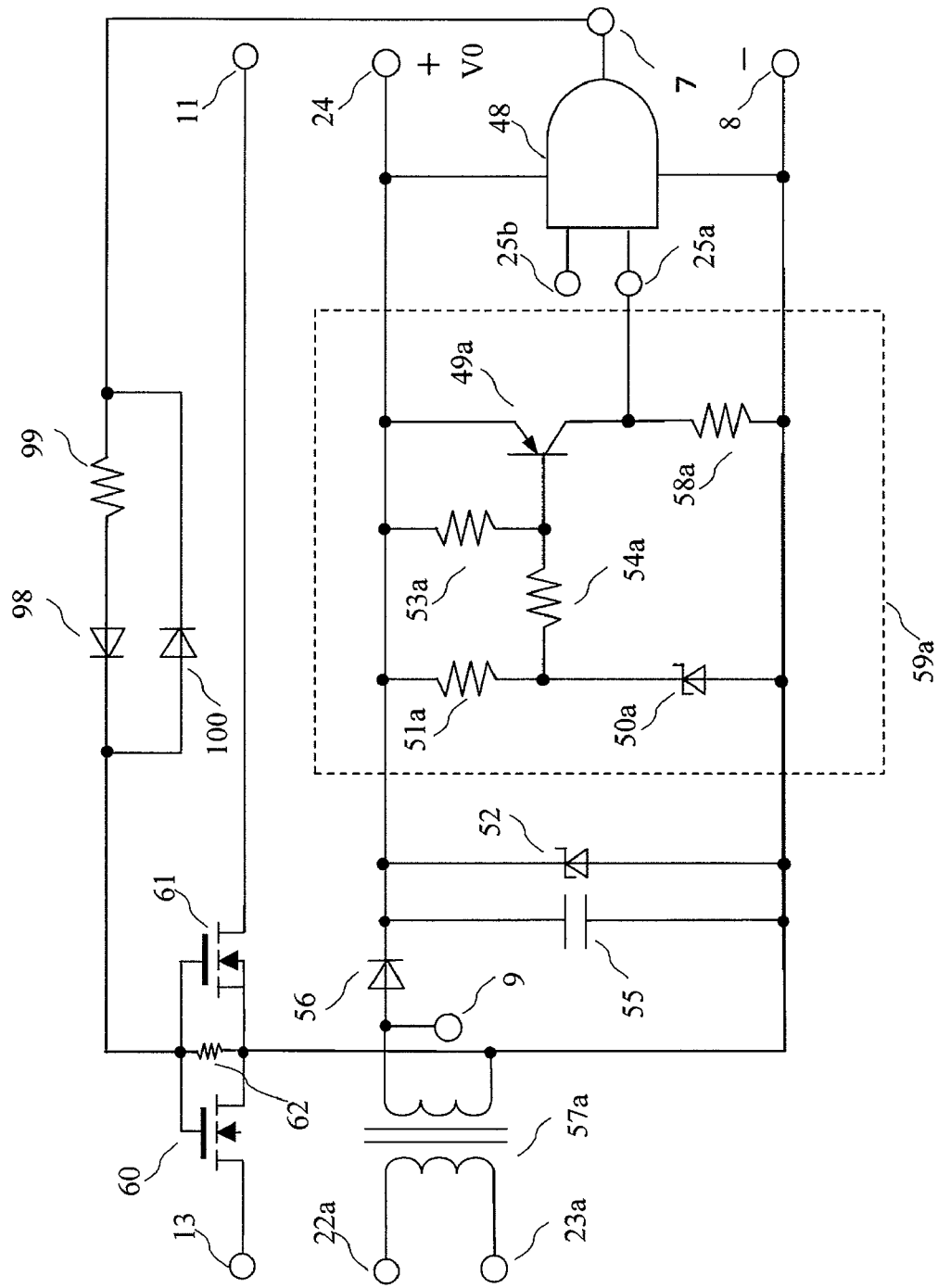
FIG. 2 is a diagram for explaining a semiconductor circuit according to a second embodiment.

FIG. 2 is a diagram for explaining a semiconductor circuit according to a second embodiment. According to this embodiment, the high-voltage switch 34 shown in FIG. 1 is formed of normally-off power MOSFETs 60, 61 as semiconductor switching elements. FIG. 2 shows a bidirectional switch in which the normally-off power MOSFET 60 and the normally-off power MOSFET 61 are connected in series in opposite directions. As a result, the reverse flow to the input-side high-voltage terminal 13 from the high-voltage terminal 11 can be prevented at the time of turning off the high-voltage switch 34. In the case where the reverse flow prevention is not required, the normally-off power MOSFET 61 is eliminated. According to this embodiment, the voltage applied to the primary terminals 22a, 23a of the transformer 57a is transmitted to the secondary terminals 9, 8, and shaped by the capacitor 55 and the diode 56 thereby to generate the DC voltage V0 of about 10 V between the terminals 24 and 8.

In FIG. 2, reference numeral 50a designates a zener diode having the breakdown voltage of 8 V, numeral 52 a zener diode having the breakdown voltage of 11 V, numeral 49a a pnp transistor, and numerals 51a, 53a, 54a, 58a resistors. Once the voltage of the terminal 24 rises 8 V or higher than the voltage of the high-voltage terminal 11, the zener diode 50a breaks down, while in the case where the voltage of the terminal 24 reaches about 9 V, the pnp transistor 49a turns on and the terminal 25a assumes a high potential. At the same time, if the terminal 25b is in high potential, the output terminal 7 of the AND circuit 48 assumes a high potential and turns on the power MOSFET 60. In the process, the soft turning-on operation using the resistor 99 relaxes the inrush current to the high-voltage terminal 11. Specifically, as in the first embodiment, in the case where the high-voltage switch 34 is turned on, the slow turning-on operation is used to relax the inrush current, while in the case where the high-voltage switch 34 is turned off for protection, the rapid turning off is possible.

A configuration, in which the terminal 25b assumes a high potential in the case where the overcurrent is not detected by the current detecting circuit 35 and a low potential in the case where the overcurrent is detected, makes it possible to turn off the high-voltage switch 34 when an overcurrent flows.

Further, though not shown in FIG. 2, a Schmidt trigger circuit may be arranged in the stage following the AND circuit 48. In this case, the high-voltage switch is turned on when the voltage V0 between the terminals 24 and 8 increases to at least the first reference voltage value, and turned off when the voltage V0 decreases to or below the second reference voltage value lower than the first reference voltage value. As a result, the unstable operation in the neighborhood of the reference voltage for turning on the high-voltage switch can be prevented. In place of the power MOSFETs 61, 60, IGBT of Si or thyristor may be used. The use of a switching element formed of a wide band gap semiconductor having a larger band gap energy than the band gap energy (2.0 eV) of Si such as SiC, however, can reliably reduce the size of the high-speed switch having a large capacity. The other points are similar to those of the first embodiment.

Embodiment 3

Figure 3:
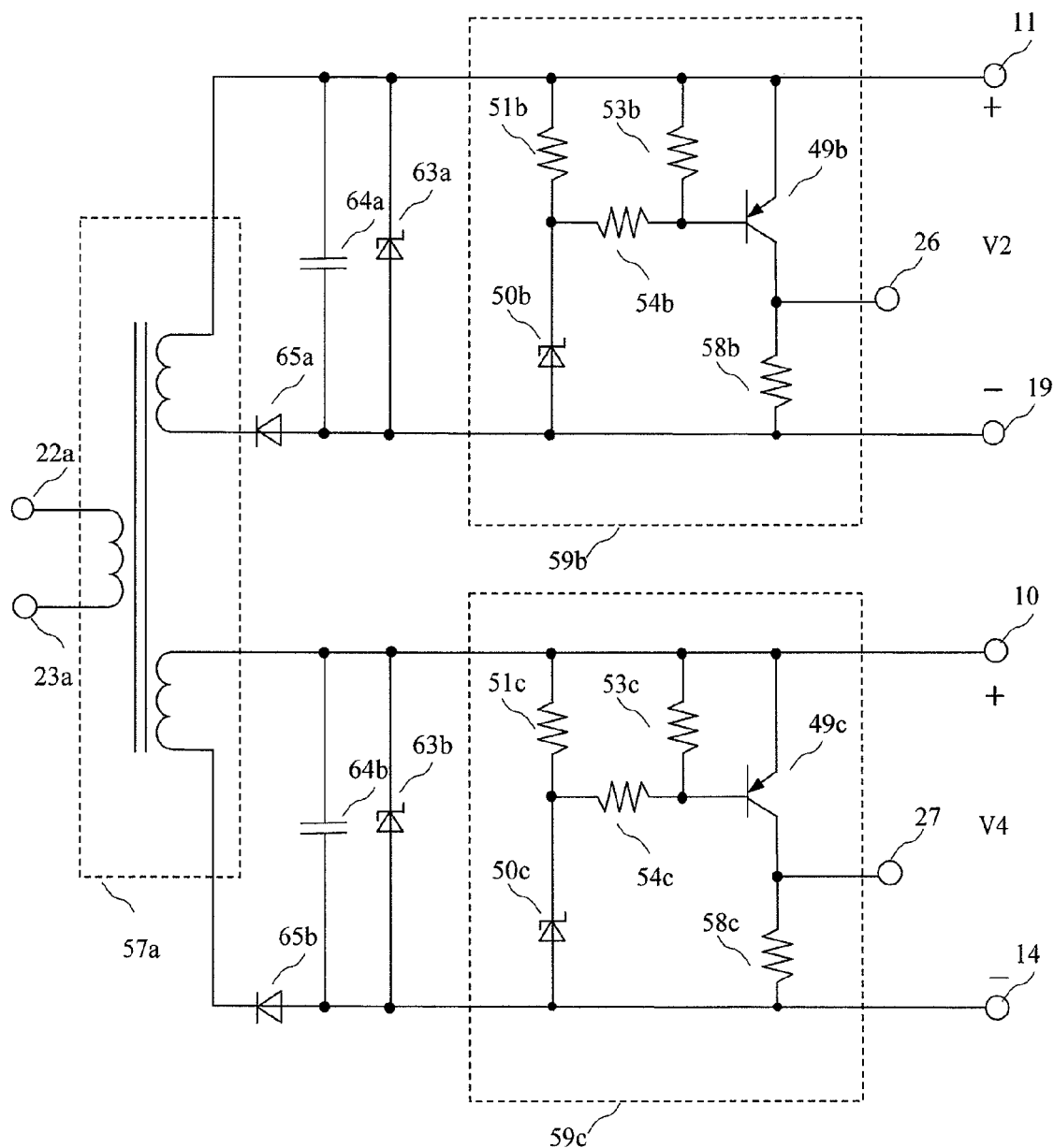
FIG. 3 is a diagram for explaining a semiconductor circuit according to a third embodiment.

FIG. 3 is a diagram for explaining the semiconductor circuit according to a third embodiment. This embodiment represents a case in which the power supplies 202, 204 shown in FIG. 1 are formed of a rectifying circuit including a transformer 57a, capacitors 64a, 64b, diodes 65a, 65b and zener diodes 63a, 63b. Nevertheless, the power supplies 202, 204 may be implemented with a DC/DC power supply. In FIG. 3, numerals 59b, 59c designate a comparator circuit which, like the circuit 59a in FIG. 2, has a reference voltage equal to the breakdown voltage value of the zener diodes 50b, 50c to determine whether the power source voltages V2, V4 have reached the desired voltage level. In the state free of the effects of the parasitic inductance or the parasitic resistance of the wiring, the power source voltages V2, V4 are set to about 25V to 40 V in the case where the threshold voltage of the switching elements 30u, 30v, 30w, 31u, 31v, 31w is –20 V. Accordingly, the breakdown voltage of the zener diodes 50b, 50c is set to between about 22 V and 38 V, and the breakdown voltage of the zener diodes 63a, 63b to between about 26V and 42V. By doing so, the output terminals 26, 27 rise to a high potential once the power source voltages V2, V4 assume the desired voltage level.

Though not shown in FIG. 3, a level shift circuit such as a photocoupler can be added to the input terminal of the AND circuit 48 of FIG. 2, so as to inform the case that the output terminals 26, 27 assume a high potential. By doing so, the high-voltage switch 34 is turned on only in the case where the power source voltages V2, V4 assume at least the desired voltage and no overcurrent flows, while the high-voltage switch 34 is turned off rapidly in the case where the power source voltage V2 or V4 drops below the desired voltage level or an overcurrent flows. In the case where the power source voltages V2, V4 fail to reach the desired voltage, the normally-on elements cannot be turned off. In the case where the power source voltages V2, V4 are decreased to or below the desired voltage level as described above, however, the high-voltage switch 34 is rapidly turned off.

On the other hand, the controlling circuits 32u, 32v, 32w and the controlling circuits 33u, 33v, 33w have the capacitors 40u, 40v, 40w and the capacitors 64u, 64v, 64w of a sufficiently large capacitance. Even after the power source voltages V2, V4 decrease to or below the desired voltage level, therefore, the lowest minimum voltage is secured to operate the switching elements 30u, 30v, 30w, 31u, 31v, 31w until the high-voltage switch 34 turns off or a high impedance is reached. As a result, the overcurrent is prevented from flowing in the high-voltage terminal 11.

Also, in the case where the voltage of the low-voltage terminals 16u, 16v, 16w increases considerably beyond the voltage of the high-voltage terminal 11 under the effect of the parasitic impedance of the wiring, etc., the transformer 57a is desirably divided into a transformer for generating the voltage V2 and a transformer for generating the voltage V4 and the primary current of the transformers is fed back in such a manner that the power source voltage of the controlling circuits 32u, 32v, 32w, 33u, 33v, 33w is included in the desired range. Specifically, the voltage difference between the high-voltage terminal 11 and the output terminal 15u, between the power source voltage terminal 19 and the output terminal 15u or between the low-voltage side voltage terminal 16u and the output terminal 15 is monitored, and in accordance with the value of this difference, the primary current of the transformers can be controlled to secure the optimum value of the voltage V2. As an alternative, the phase current, the interphase current or the interphase voltage and the optimum primary current conditions of the transformer associated with such current or voltage are determined in advance to secure the optimum value of the voltage V2. The other parts of the configuration are identical with those of the first and second embodiments.

Embodiment 4

Figure 4:
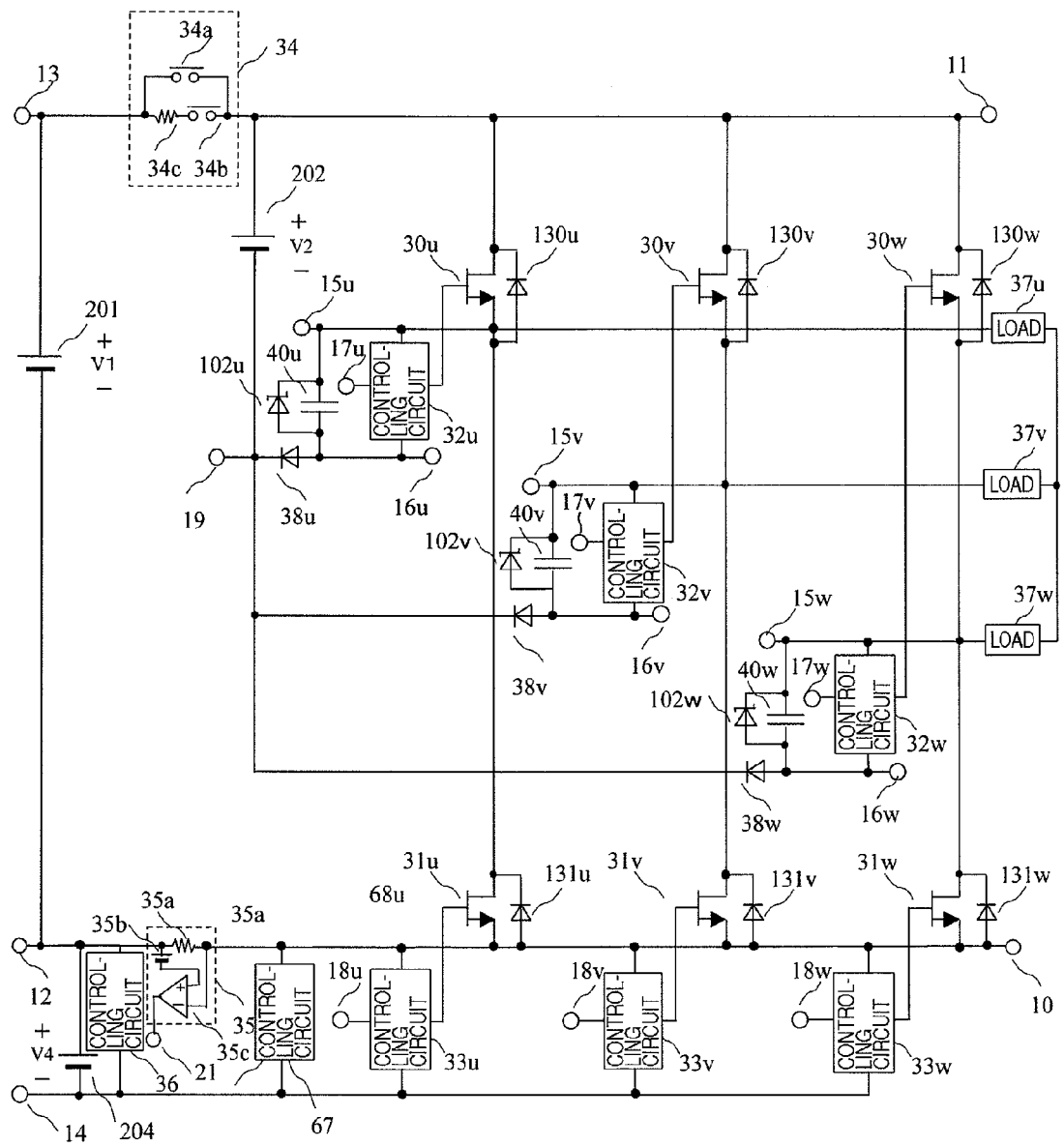
FIG. 4 is a diagram for explaining a semiconductor circuit according to a fourth embodiment.

FIG. 4 is a diagram for explaining the semiconductor circuit according to a fourth embodiment. According to this embodiment, the controlling circuit 36 shown in FIG. 1 is operated between the high-voltage terminal 11 and the voltage terminal 14. According to this embodiment, the power supply 203 and the terminal 20 shown in FIG. 1 are eliminated and the circuit is simplified. The other parts of the configuration are identical with those of the first embodiment.

Embodiment 5

Figure 5:
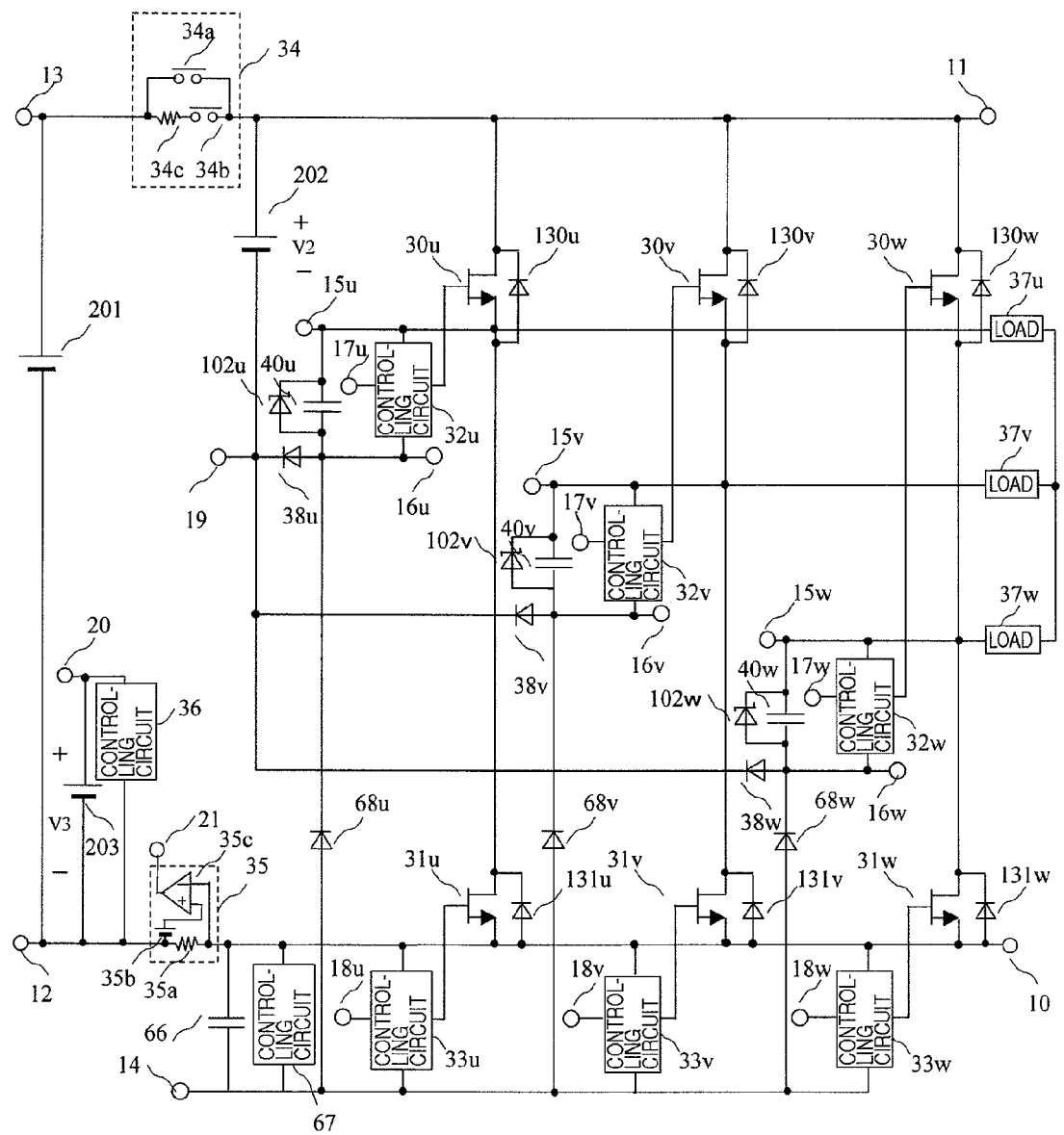
FIG. 5 is a diagram for explaining a semiconductor circuit according to a fifth embodiment.

FIG. 5 is a diagram for explaining the semiconductor circuit according to a fifth embodiment. According to this embodiment, the function of the power supply 204 shown in FIG. 1 is implemented by the capacitor 66 and the diodes 68u, 68v, 68w so that the voltage V4 is generated across the capacitor 66 as in the power supply 204 shown in FIG. 1.

In the circuit according to this embodiment, each time the high-voltage-side voltage terminals 15u, 15v, 15w providing output terminals are reduced to a low potential, the energy that has thus far been charged to the capacitors 40u, 40v, 40w is charged to the capacitor 66 thereby to generate the voltage V4 at the voltage terminal 14 of the negative power supply in the same manner as in FIG. 1. According to this embodiment, the battery and the transformer for implementing the power supply 204 are eliminated, and therefore, the circuit can be further reduced in size as compared with the embodiment shown in FIG. 1.

Incidentally, in the case where the current flows in the controlling circuits 33u, 33v, 33w in the standby state where no current is supplied to the load, the voltage of the voltage terminal 14 rises and the power source voltage V4 required to operate the controlling circuits is decreased. As a countermeasure against this inconvenience, according to this embodiment, the control operation to increase the potential of all the high-voltage-side voltage terminals 15u, 15v, 15w constituting output terminals to a high level is alternated with the control operation to decrease the potential of all the high-voltage-side voltage terminals 15u, 15v, 15w constituting output terminals to a low level during the standby state. In this way, the power source voltage V4 required for operation of the controlling circuits 33u, 33v, 33w is held by supplying substantially no current to the loads 37u, 37v, 37w.

The capacitors 40u, 40v, 40w connected to the high-voltage-side voltage terminals 15u, 15v, 15w constituting output terminals according to this embodiment are charged by the voltage rise of the output terminals thereby to reduce the voltage rising rate of the output terminals. Also, the capacitor 66 is charged and the output voltage turn-off speed is reduced only during the period when the output terminal voltage is decreased and the diodes 68u, 68v, 68w connected to the capacitors 40u, 40v, 40w are biased forward.

Even in the case where the voltage rising rate or the voltage turn-off speed of the output terminals is increased, therefore, the ratio dV/dt can be suppressed in the neighborhood of the high and low voltage terminals, and an excessively large voltage is prevented from being applied to the switching elements under the effect of the wiring impedance. As a result, the noises such as the wiring impedance and the design margin of the breakdown voltage of the switching elements are reduced. Also, the energy charged to the capacitors 40u, 40v, 40w works in such a direction as to charge between the high voltage terminal 11 and the reference voltage terminal 10, and therefore, the power consumption can be reduced. According to this embodiment, the voltage of the power source voltage terminal 19 connected with the diodes 38u, 38v, 38w and the voltage of the voltage terminal 14 connected with the diodes 68u, 68v, 68w are determined in such a manner that the power source voltages of the controlling circuits 32u, 32v, 32w and the controlling circuits 33u, 33v, 33w assume the desired value. In the case where the soft switching operation serves the purpose, however, the diodes 38u, 38v, 38w, for example, may be connected to the high voltage terminal 11, and the diodes 68u, 68v, 68w to the reference voltage terminal 10 or the terminal 20 more positive than the reference voltage terminal 10.

In order to realize the soft switching operation easily only at the high voltage terminal, on the other hand, the diodes 68u, 68v, 68w are eliminated and a resistor is connected in parallel to the capacitors 40u, 40v, 40w, so that the charge in the capacitors 40u, 40v, 40w may be discharged through the resistor. The other component parts are identical with those in the first embodiment.

Figure 6:
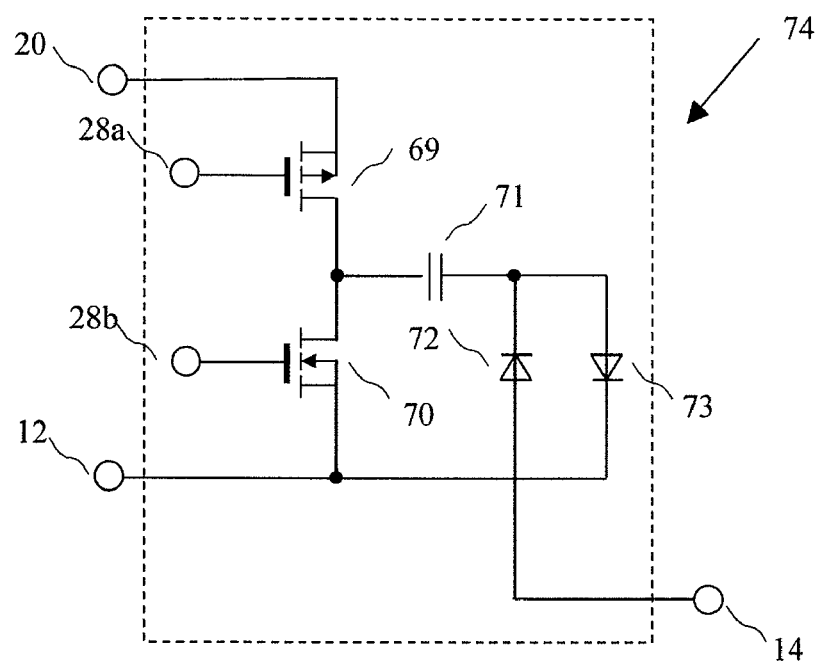
FIG. 6 is a diagram for explaining a semiconductor circuit according to a sixth embodiment.

FIG. 6 shows a step-down charge pump circuit of the semiconductor circuit according to this embodiment. This circuit is built in the controlling circuit 36 shown in FIG. 5. Specifically, the capacitor 71 is charged first by the alternate on/off control operation of the switching elements 69, 70 when the capacitor 66 is discharged and the voltage V4 is reduced to or below the desired value, further followed by the operation of charging the capacitor 66 for the lower-arm power supply from the capacitor 71. These operations are repeated. As a result, the voltage terminal 14 of the negative power supply is charged to the desired voltage. According to this embodiment, therefore, without controlling the voltage of the high-voltage-side voltage terminals 15u, 15v, 15w constituting the output terminals in the standby state where no current is supplied to the load, the required voltage V4 can be always charged to the controlling circuits 33u, 33v, 33w. The voltage between the input-side reference voltage terminal 12 and the voltage terminal 14 assumes substantially the same value as the voltage between the terminal 20 and the input-side reference voltage terminal 12. By making multiple stages of the charge pump circuit, however, the voltage terminal 14 can be set to a still lower desired voltage level. The other parts of the configuration are identical with those of the fifth embodiment.

Embodiment 7

Figure 7:
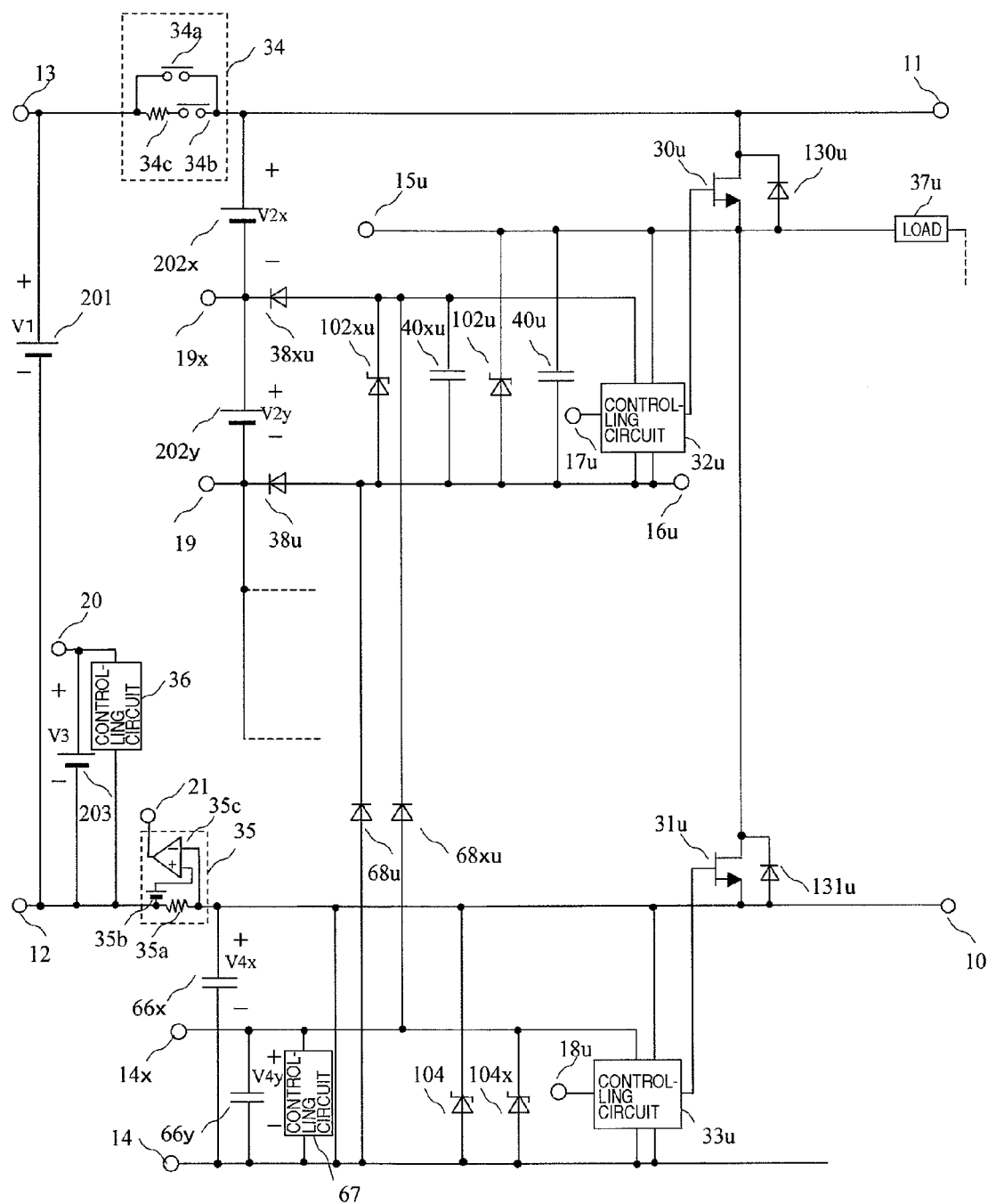
FIG. 7 is a diagram for explaining a semiconductor circuit according to a seventh embodiment.

FIG. 7 is a diagram for explaining the semiconductor circuit according to a seventh embodiment. Although only the U phase is shown in FIG. 7, the V and W phases have a similar configuration. This embodiment represents a case in which the controlling circuits have two types of power supply. According to this embodiment, therefore, the power supply 202 shown in the fifth embodiment of FIG. 5 is divided into power supplies 202x and 202y. Also, in addition to the diodes 38u, 68u, diodes 38xu, 68xu are inserted to supply the voltage also to the power supply terminals 19x, 14x. As a result, power can be supplied to the circuit for operating the controlling circuits at high voltage and the circuit for operating the controlling circuits at low voltage. The other parts of the configuration are identical with those of the fifth embodiment.

Embodiment 8

Figure 8:
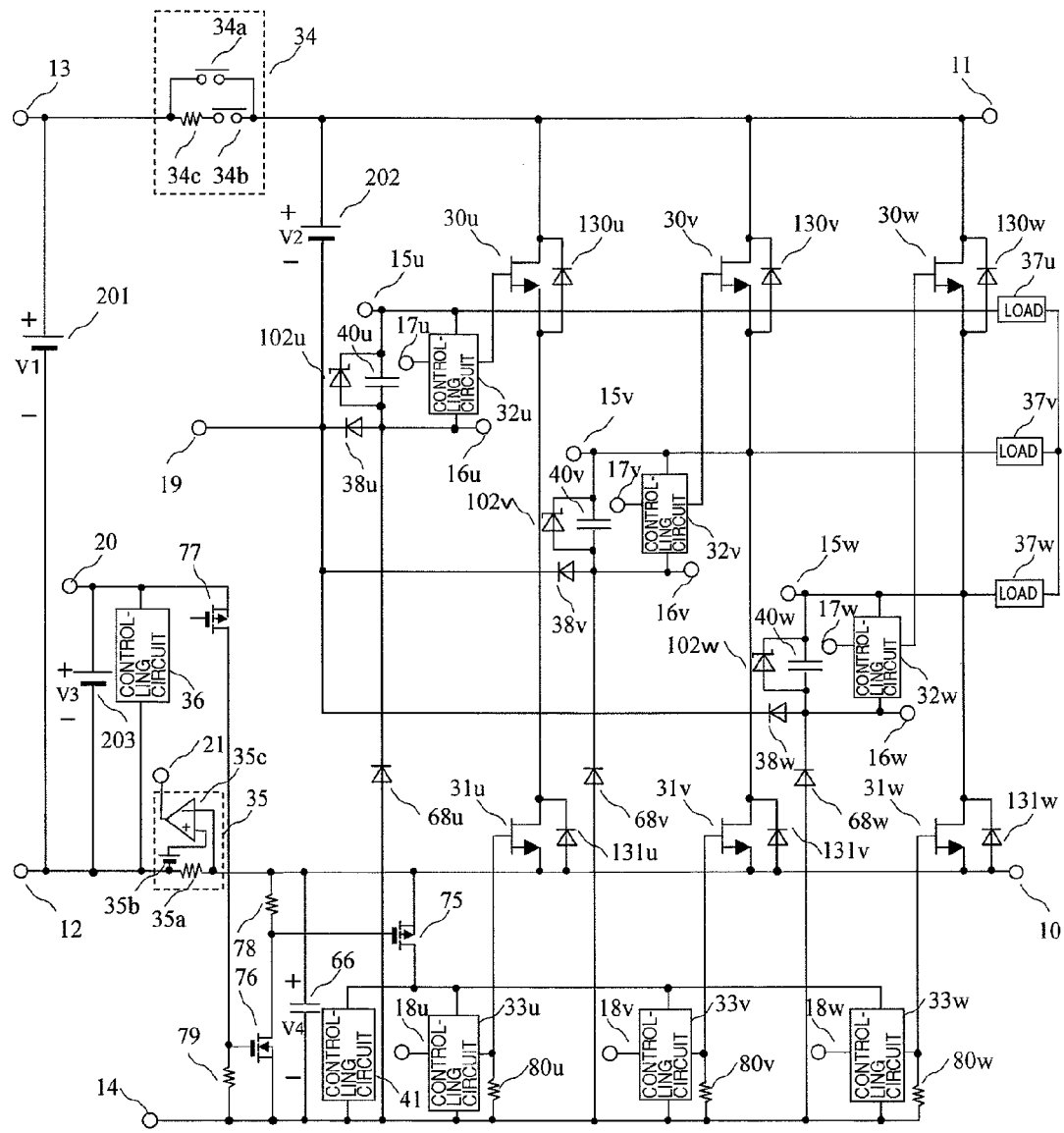
FIG. 8 is a diagram for explaining a semiconductor circuit according to an eighth embodiment.

FIG. 8 is a diagram for explaining the semiconductor circuit according to an eighth embodiment. According to this embodiment, in order to retard the voltage drop of the voltage V4 due to the discharge of the capacitor 66 as far as possible even in the standby state where the current supply to the load is stopped by turning off the switching elements 31u, 31v, 31w, a switching element 75 is inserted in series to the controlling circuits 33u, 33v, 33w on the high-voltage terminal side of the controlling circuits 33u, 33v, 33w.

During the normal operation, the switching element 77 is turned on, so that the switching elements 76, 75 are turned on thereby to supply the current to the controlling circuits 33u, 33v, 33w. In the standby state, on the other hand, the switching element 77 is turned off thereby to turn off the switching elements 76, 75. At the same time, the power source voltage of the controlling circuits 33u, 33v, 33w drops and the circuit ceases to operate. According to this embodiment, resistors 80u, 80v, 80w are connected between the gate terminal of the lower-arm switching elements 31u, 31v, 31w and the low-voltage terminal of the controlling circuits 33u, 33v, 33w to turn off the lower-arm switching elements 31u, 31v, 31w in the standby state. Although only one common set of the switching elements 76, 75 is provided for the controlling circuits 33u, 33v, 33w according to this embodiment, the switching elements 76, 75 may be provided for each phase with equal effect. Incidentally, this circuit can be used also in such a manner that the normally-on switching elements 31u, 31v, 31w are turned off or the impedance is increased during such a fault as a power failure or disconnection when the voltage V3, V4 drops to or below a specified level. Specifically, according to this embodiment, in order to prevent the negative voltage V4 from decreasing during a fault, the normally-off switching element 75 can be turned off while stopping the current supply to the controlling circuits 41, 33u, 33v, 33w. As a result, the normally-on switching elements 30u, 30v, 30w, 31u, 31v, 31w and the load thereof are prevented from breaking down under an excessive current which otherwise might flow therein during a fault. The other component parts are identical with those of the fifth embodiment.

Embodiment 9

Figure 9:
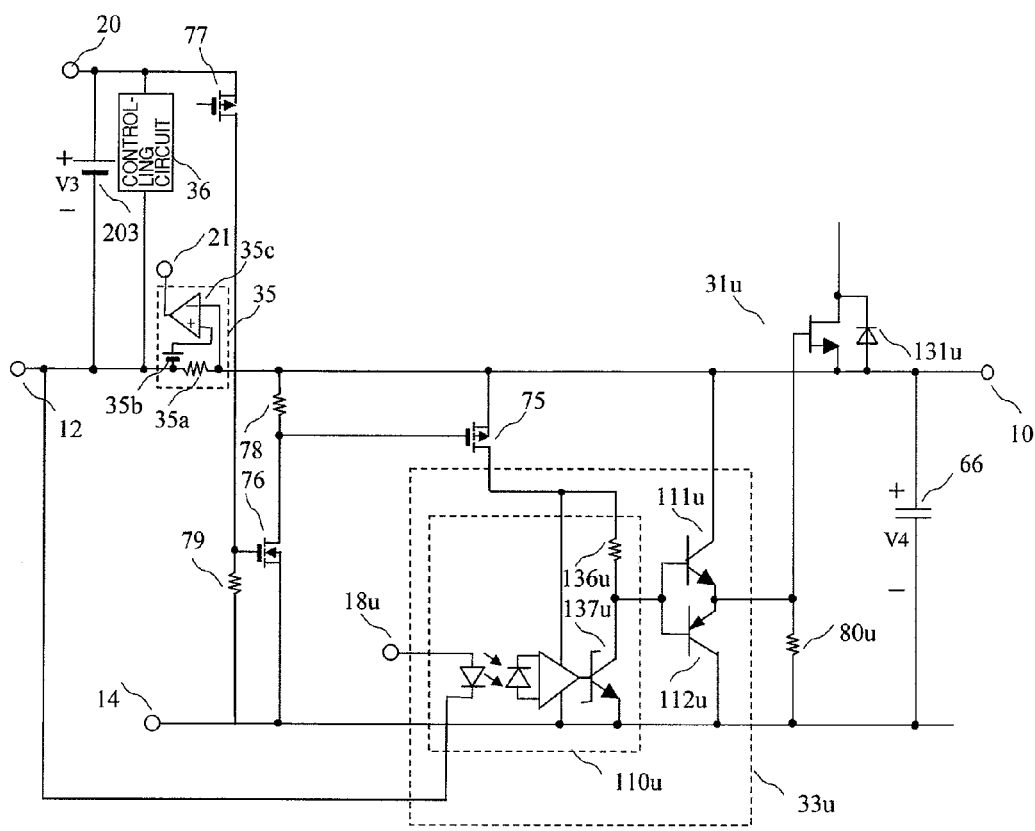
FIG. 9 is a diagram for explaining a semiconductor circuit according to a ninth embodiment.

FIG. 9 is a diagram for explaining the semiconductor circuit according to a ninth embodiment. Although only the parts different from those of FIG. 8 are shown in U phase, the circuit configuration is similar also for the V and W phases. According to this embodiment, a switching element 75 is connected in series with the controlling circuits 33u, 33v, 33w on the high-voltage terminal side thereof. Also, only the photocoupler circuit unit 110u, but not the emitter follower transistors 111u, 112u, is connected in series with the switching element 75, so that the current to the controlling circuits 33u, 33v, 33w, 41 may be turned off during the standby state. According to this embodiment, the current to the emitter follower transistors 111u, 112u from the reference voltage terminal 10 is stopped during the standby state, and therefore, the switching element 75 is not used to stop the current supply.

The photocoupler circuit unit 110u is formed of a normal resistance load 136u to achieve the voltage gain easily. This provides a current of the controlling circuits during the standby state. Therefore, the switching element 75 is used to stop the current supply only for the photocoupler circuit unit 110 constituting the voltage amplifier circuit of the photocoupler. In this way, the power required to turn off the normally-off lower-arm switching elements is reduced thereby to prevent the negative power source voltage V4 from decreasing. The other component parts are identical with those of the eighth embodiment.

Embodiment 10

Figure 10:
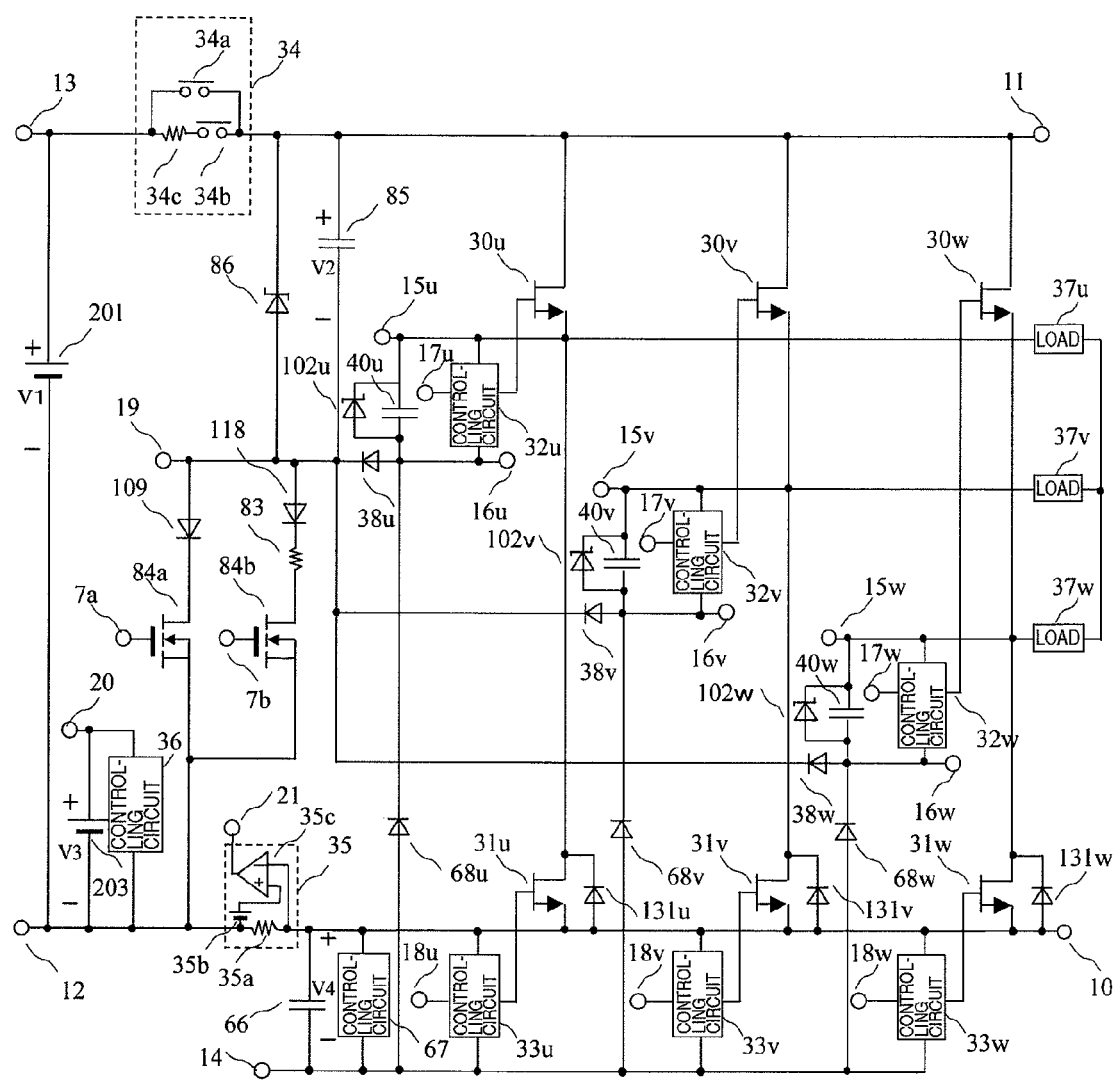
FIG. 10 is a diagram for explaining a semiconductor circuit according to a tenth embodiment.

FIG. 10 is a diagram for explaining the semiconductor circuit according to a tenth embodiment. According to this embodiment, a capacitor 85 is used in place of the power supply 202 for the voltage V2. In turning on the voltage of the high-voltage terminal 11 according to this embodiment, the switching element 84a is turned on first of all, and when increasing the voltage of the high-voltage terminal 11, the capacitor 85 is charged to the desired voltage, after which the switching element 84a is turned off. After the high-voltage terminal 11 increases to the desired voltage, the switching element 84b is turned on, and a current path is formed between the power source voltage terminal 19 and the input-side reference voltage terminal 12. The voltage of the power source voltage terminal 19 is controlled in such a manner that the breakdown voltage of the zener diode 86 is set to V2 and the capacitor 85 thereby works similarly to the power supply 202 in other embodiments. According to this embodiment, in order to limit the current flowing in this current path, the capacitor 85 is charged to the desired voltage through the resistor 83. In the case where the decrease in the charge voltage of the capacitor 85 is small, the switching element 84b may be turned off to suppress the power consumption. This embodiment simplifies the implementation of the power supply 202. The other component parts are identical with those of the fifth embodiment.

Embodiment 11

Figure 11:
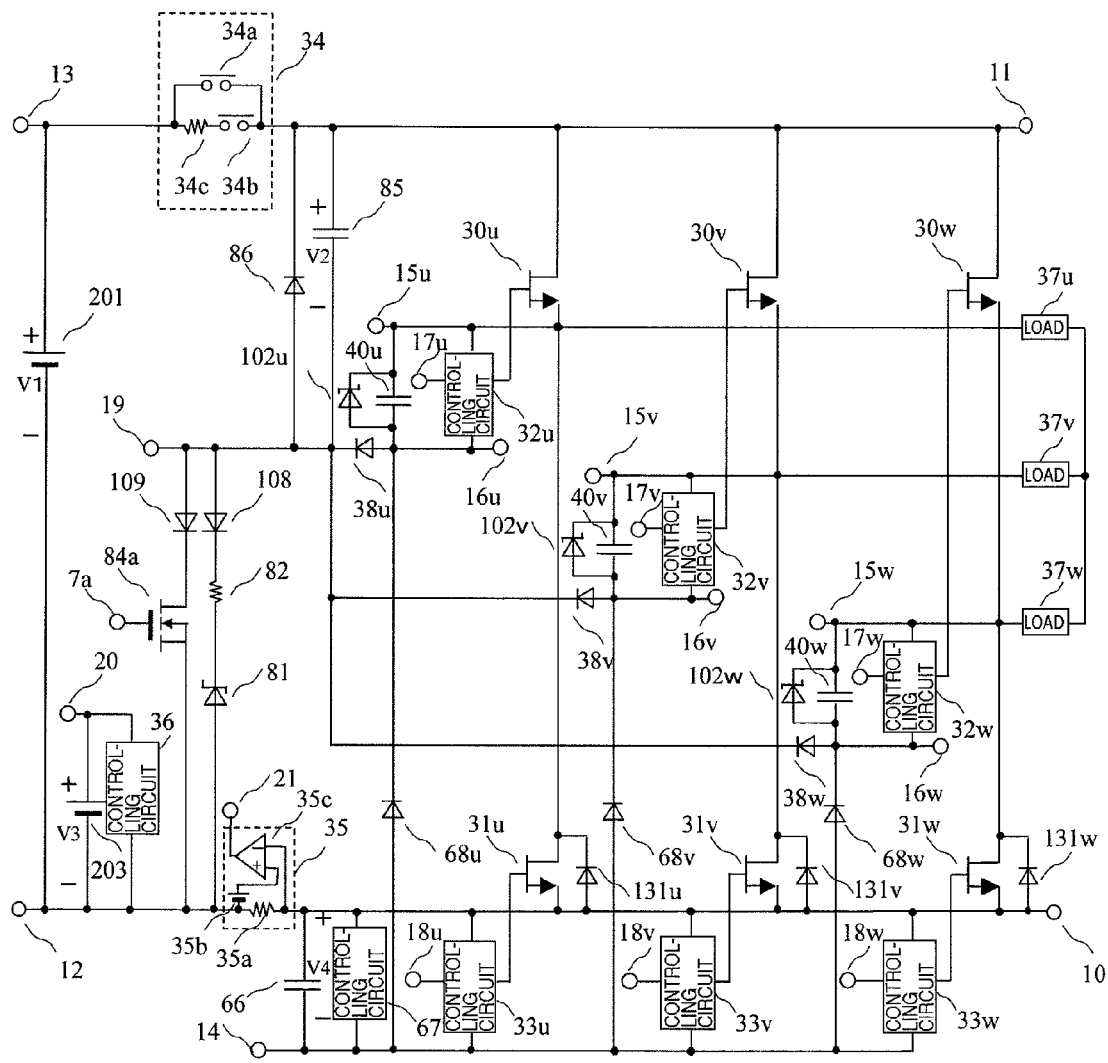
FIG. 11 is a diagram for explaining a semiconductor circuit according to an 11th embodiment.

FIG. 11 is a diagram for explaining the semiconductor circuit according to an 11th embodiment. In the ninth embodiment, a zener diode 86 is used, and in the case where the charge voltage of the capacitor 85 used as the power supply 202 is reduced, the charge voltage of the capacitor 85 is controlled to the desired voltage by turning on the switching element 84b. According to the 11th embodiment, on the other hand, in the case where the charge voltage of the capacitor 85 drops, the zener diode 81 inserted between the power source voltage terminal 19 and the input-side reference voltage terminal 12 breaks down, and the capacitor 85 is charged to the desired voltage range. This embodiment eliminates the need of the operation to control the charge voltage of the capacitor 85 using the switching element 84b. The other component parts are identical with those of the ninth embodiment.

Embodiment 12

Figure 12:
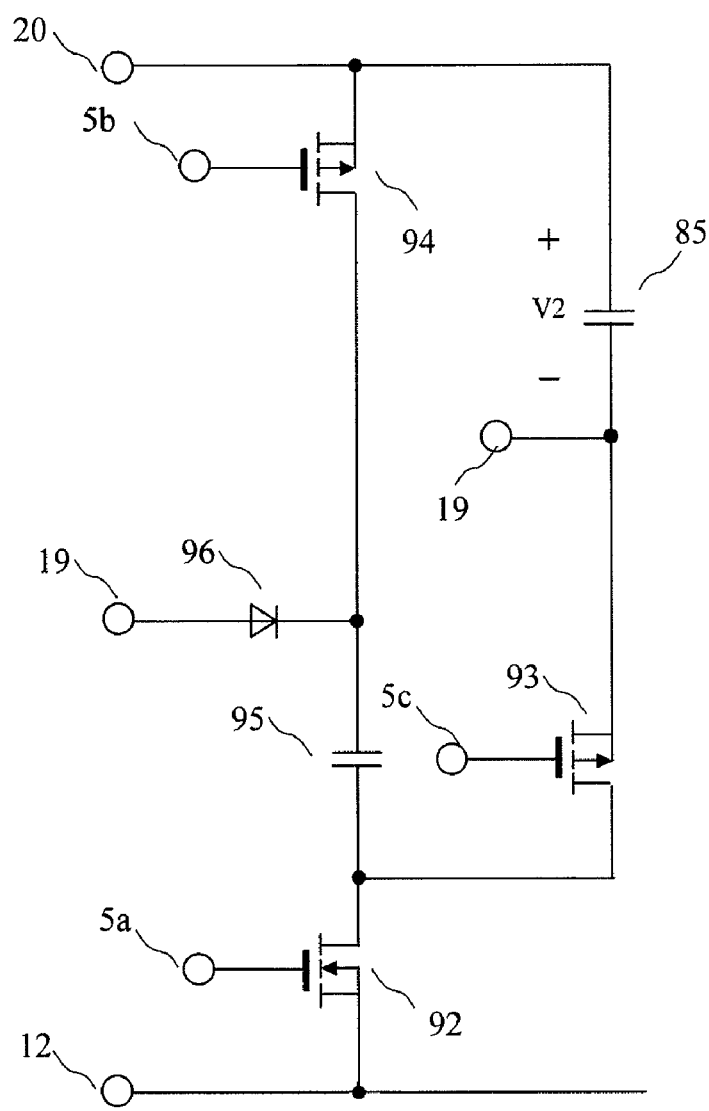
FIG. 12 is a diagram for explaining a semiconductor circuit according to a 12th embodiment.

FIG. 12 is a diagram for explaining a semiconductor circuit according to a 12th embodiment. According to this embodiment, the power supply 202 is realized by the method different from those shown in FIGS. 3 and 10. Specifically, according to this embodiment, after turning on a switching element 92 and charging a capacitor 95, the switching element 92 is turned off and the switching element 94 turned on. After that, with the turning on of the switching element 93, the energy charged to the capacitor 95 moves to and charge the capacitor 85. With the decrease in the energy movement, the switching elements 93, 94 are turned off and the switching element 92 turned on thereby to recharge the capacitor 95. By repeating this operation, the energy charged using the power source voltage terminal 19 on the low-voltage side is charged to the capacitor 85 arranged at the high-voltage terminal 11. In this embodiment, the capacitor 85 can be charged using a low voltage source at the reference voltage terminal 10, and therefore, the power consumption of the controlling circuits is reduced. The other component parts are identical with those of the fifth embodiment.

Embodiment 13

Figure 13:
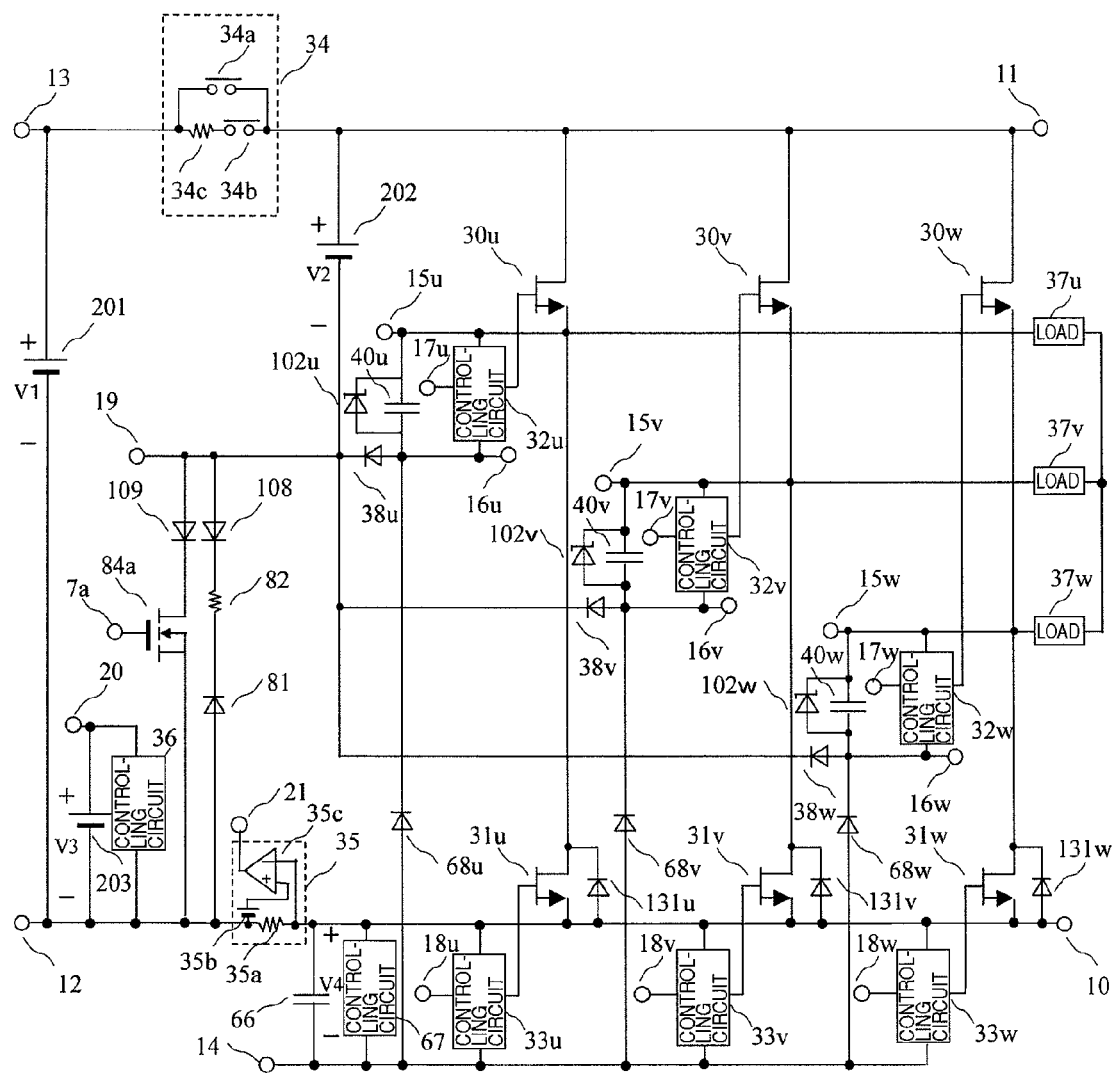
FIG. 13 is a diagram for explaining a semiconductor circuit according to a 13th embodiment.

FIG. 13 is a diagram for explaining the semiconductor circuit according to a 13th embodiment. This embodiment is equivalent to the embodiment shown in FIG. 5 having the power supply 202 for the voltage V2, which, like in FIG. 11, includes the switching element 84a, the zener diode 81, the diodes 108, 109 and the resistor 82 for auxiliary purposes. Even in the case where the voltage V2 fails to assume the desired value due to a fault of the power supply 202, the voltage of the power supply 202 can be set to the desired voltage level by turning on the switching element 84a. Also, in the case where the voltage of the power supply 202 drops while the high-voltage terminal 11 is at high voltage level, the zener diode 81 breaks down and the power source voltage terminal 19 assumes the desired voltage. As a result, the reliability is increased. In the case where a breakdown current exceeding a specified value continues to flow in the zener diode 81, a fault of the power supply 202 is determined and an alarm signal can be issued or the switch 34 turned off for a further improved reliability. The other component parts are identical with those of the fifth embodiment.

Embodiment 14

Figure 14:
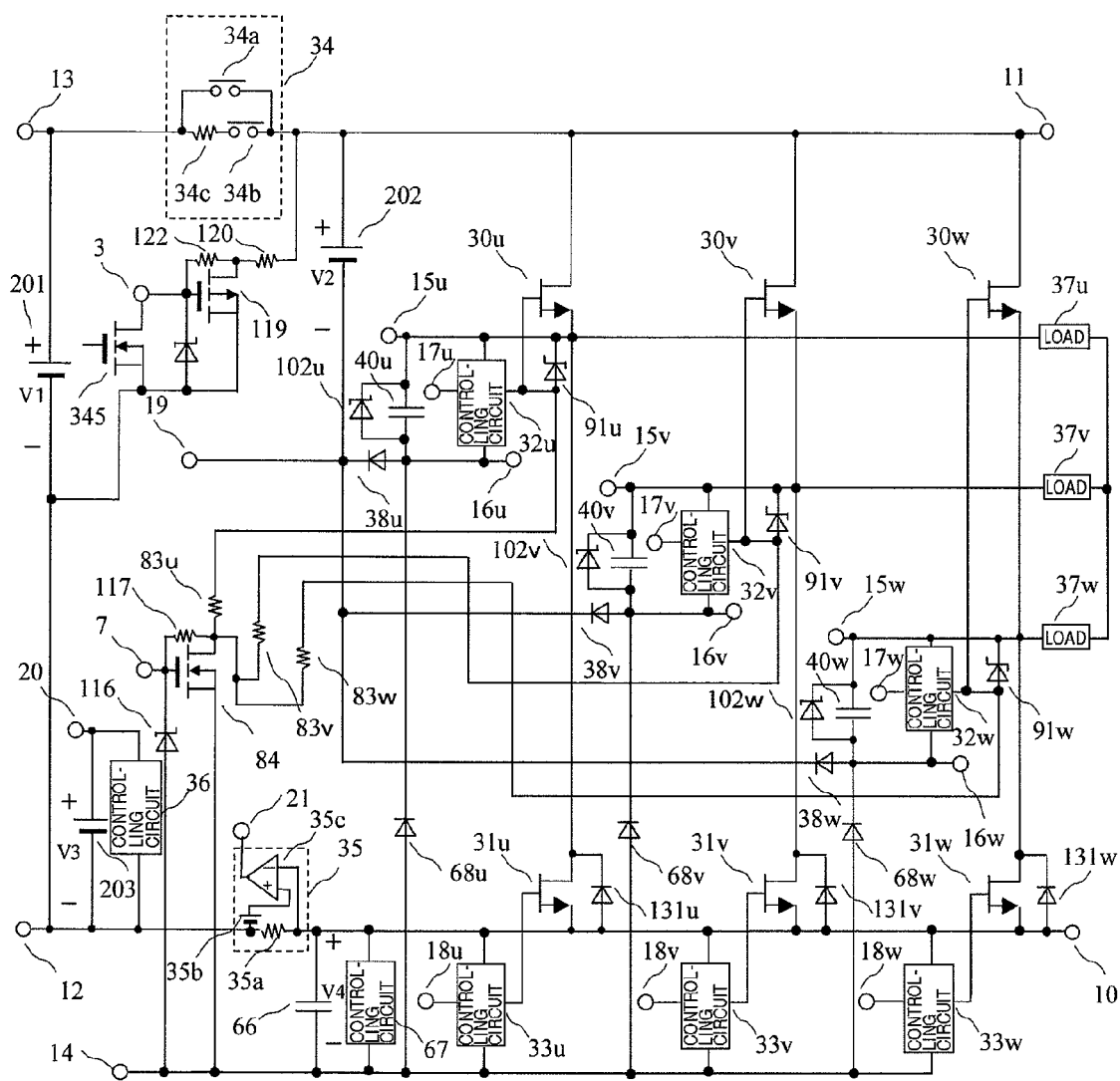
FIG. 14 is a diagram for explaining a semiconductor circuit according to a 14th embodiment.

FIG. 14 is a diagram for explaining the semiconductor circuit according to a 14th embodiment. According to this embodiment, a switching element 84 for reducing the gate voltage of the upper-arm switching elements 30u, 30v, 30w shown in FIG. 5 is inserted between the gate terminal of the upper-arm switching elements 30u, 30v, 30w and the voltage terminal 14 on the negative voltage side in such a manner as to forcibly turn off the upper-arm switching elements 30u, 30v, 30w.

The zener diodes 91u, 91v, 91w are protective diodes for preventing the gate-source voltage of the switching elements 30u, 30v, 30w from excessively increasing, and the resistor 83 is included to suppress the current of the switching element

84. Also, the diodes 109u, 109v, 109w are inserted so that the gate terminal of the upper-arm switching elements 30u, 30v, 30w may assume a negative voltage. Incidentally, according to this embodiment, a high resistor 117 is inserted between the drain and gate of the switching element 84, and the zener diode 116 for gate protection is interposed between a gate and source of the switching element 84.

The circuit including the switching element 84 is activated with the power supplied from the power supply 203, and normally turned off by reducing the gate-source voltage of the switching element 84 to or lower than the threshold voltage. In the case of a power failure or the like situation where the power supply of the controlling circuits decreases, however, the gate terminal 6 is opened. Then, the switching element 84 is turned on by the current flowing into the gate terminal 7 from the resistor 117, and the upper-arm switching elements 30u, 30v, 30w can be forcibly turned off without activation of the upper-arm control circuits. In the case where the high-voltage terminal 11 is high in voltage, the operation of forcibly turning off the upper-arm switching elements 30u, 30v, 30w is continued even after the source voltage of the power supply 203 is reduced to zero. As a result, even in the case where the upper-arm switching elements 30u, 30v, 30w are of normally-on type, the shorting current is prevented from flowing from the high-voltage terminal 11 to the low-voltage terminal (reference voltage terminal 10) when a fault develops in which the power supply for the controlling circuits is decreased.

Incidentally, according to this embodiment, in order to reduce the number of the switching elements, only one switching element 84 is used collectively for U, V and W phases. Nevertheless, a switching element may be provided for each phase, and the upper-arm switching elements 30u, 30v, 30w may be turned off under optimum conditions.

Also, according to this embodiment, a switching element 119 is inserted between the high-voltage terminal 11 and the reference voltage side terminal as a means for reducing the voltage at the high-voltage terminal 11 in the case where the power source voltage of the power supply 203 of the controlling circuit 36 is decreased to such an extent that the voltage higher than a specified level cannot be supplied. The switching element 119 is turned on according to the same principle as the switching element 84 when the power supply 203 of the controlling circuit 36 decreases below the specified level. In the case where a high voltage is applied to the high-voltage terminal 11, a normally-off switching element 345 inserted between the terminals 3 and 12 and adapted to operate by the power supplied from the power supply 203 is turned on thereby to turn off the switching element 119. In the case where the voltage of the high-voltage terminal 11 is decreased at the time of a fault, the normally-off switching element 345 is turned off. As an alternative, in the case where the normally-off switching element 345 is turned on by the power supplied from the power supply 203, the decrease in the power source voltage of the power supply 203 turns off the normally-off switching element 345. Then, as long as the high-voltage terminal 11 is high in voltage, the current flows in the resistor 120, 122 and the switching element 119 turns on thereby to reduce the voltage of the high-voltage terminal. In this configuration, the zener diode 121 acts to protect the gate of the MOSFET used as the switching element 119. In this way, the energy charged between the high-voltage terminal 11 and the reference voltage terminal 10 and the current flowing reversely from the load can be relieved through a current path including the resistor 20 and the switching element 119.

The switching element 119, though arranged between the high-voltage terminal 11 and the reference voltage side terminal in this embodiment, may alternatively be inserted between the high-voltage terminal 11 and the negative voltage terminal 14.

Further, though not shown in FIG. 14, like the switching element 84 or 119, a switching element adapted to turn off in the case where the power source voltage of the controlling circuits increases to a voltage not lower than a first reference voltage and turn on in the case where the power source voltage decreases to or below a second reference voltage lower than the first reference voltage may be used for controlling the high-voltage switch 34. This configuration can be realized in such a manner that a switching element, which is adapted to turn off when the power source voltage of the controlling circuit assumes a voltage not lower than the first reference voltage and turn on when the power source voltage of the controlling circuit assumes a voltage not higher than a second reference voltage lower than the first reference voltage, is inserted between the gate terminal of the power MOSFETs 60, 61 providing switching elements shown in FIG. 2 and the reference voltage terminal 10, the input-side reference voltage terminal 12 or the voltage terminal 14.

According to this embodiment, in the case where the DC power source voltage of the power supply of the controlling circuit of the normally-on switching element drops and the normally-on switching element cannot be normally controlled, the power switching element can be turned off forcibly by applying a negative voltage between the gate and source of the normally-on switching element without the power supply of the controlling circuit, and further, the power supply capacitor between the high-voltage terminal and the low-voltage terminal is discharged by reducing the voltage of the high-voltage terminal 11 or the reverse current can be discharged from the load. As a result, the overcurrent is prevented from flowing in the power switching element. The normally-on switching element can be protected effectively also by using a floating power supply for the upper-arm switching elements 30u, 30v, 30w and a power supply circuit for generating the source voltage V4 without the power supply 202. Also, the normally-on upper-arm switching elements 30u, 30v, 30w can be effectively driven by a pulse transformer requiring no DC power source voltage for the controlling circuits 32u, 32v, 32w. Specifically, this method can be used for the protection also in the case where the drive signal ceases to be applied to the normally-on switching element driven by the pulse transformer. Although this embodiment is explained above with reference to a case in which the voltage of the power supply 203 is monitored for protective operation, the protective operation can be performed also by monitoring the voltage V2 of the power supply 202, the source voltage V4 or the power source voltage of the upper-arm controlling circuits 32u, 32v, 32w. The other parts of the configuration are identical with those of the fifth embodiment.

Embodiment 15

Figure 15:
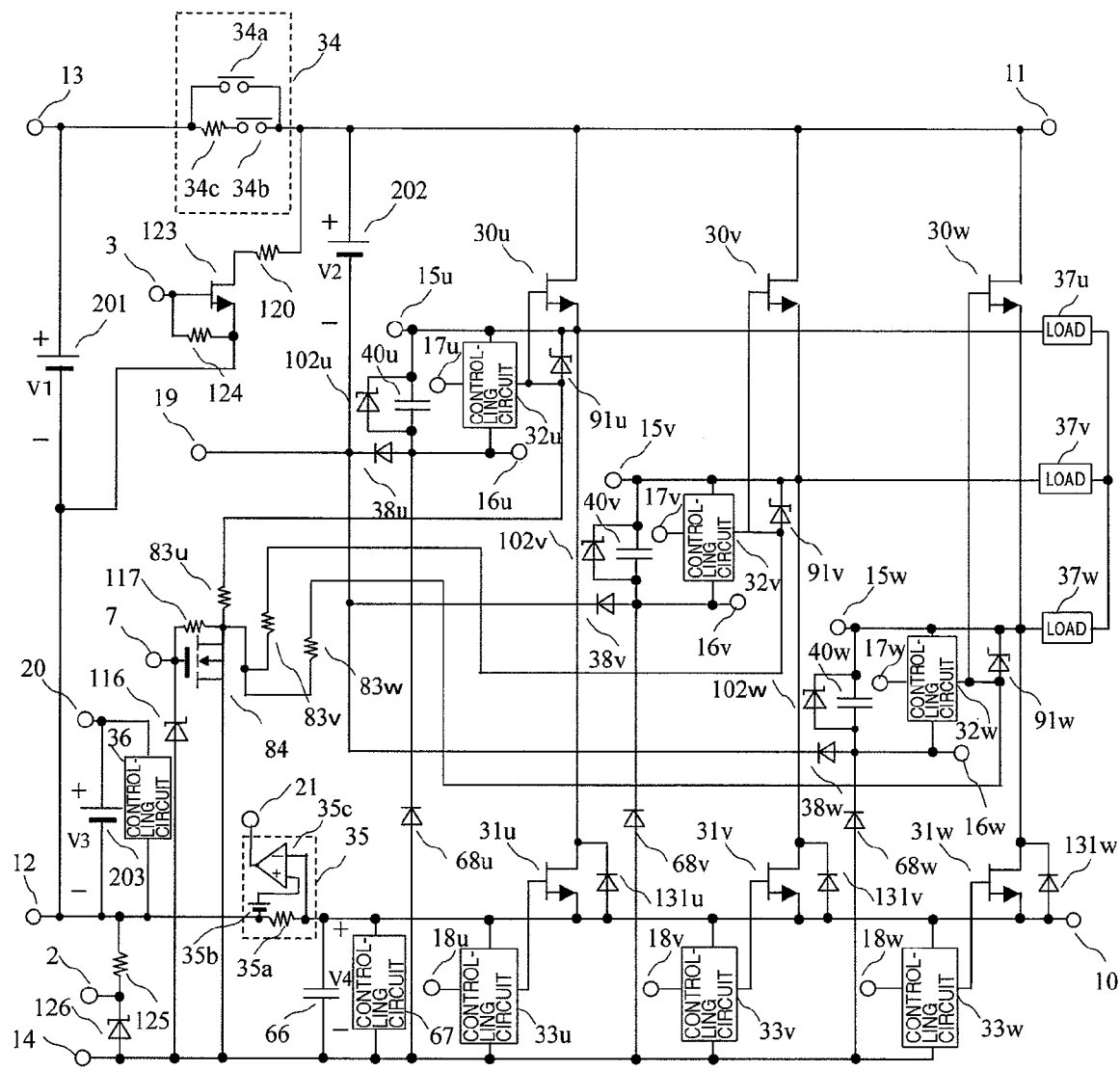
FIG. 15 is a diagram for explaining a semiconductor circuit according to a 15th embodiment.

FIG. 15 is a diagram for explaining the semiconductor circuit according to a 15h embodiment. This embodiment is different in that a normally-on switching element 124 is used in place of the normally-off switching element 119 of FIG. 14.

According to this embodiment, a zener diode 126 is inserted between the input-side reference voltage terminal 12 and the voltage terminal 14, and the breakdown voltage of the zener diode 126 is used as a reference voltage for monitoring the power source voltage V4 of the controlling circuits.

According to this embodiment, the terminal 3 is connected to the terminal 2, and in the case where the power source voltage V4 for the controlling circuits is not lower than a specified voltage, a sufficient negative voltage to turn off the normally-on switching element 123 is applied to the terminal 2. With the decrease of the voltage difference between the input-side reference voltage terminal 12 and the voltage terminal 14, the voltage difference between the input-side reference voltage terminal 12 and the terminal 2 decreases at the same time. With the decrease of the controlling circuit power supply V4 to or below a specified voltage, on the other hand, the voltage of the terminal 2 increases, and with the increase of the voltage at the terminal 2 to or beyond the threshold voltage of the normally-on switching element 119, the normally-on switching element 119 is turned on.

In the case where the terminal 3 is connected to the terminal 2 as in this embodiment, the presence of the resistor 125 eliminates the need of the resistor 124. Incidentally, in the case where the terminal 2 is connected not directly to the terminal 3 but through a circuit having the hysteresis characteristic like the Schmidt trigger circuit, the control operation is made possible in which the increase in the voltage difference between the terminal 12 and the voltage terminal 14 beyond a first specified voltage value turns off the normally-on switching elements 31$u$, 31$v$, 31$w$, while the decrease of the voltage difference between the input-side reference voltage terminal 12 and the voltage terminal 14 to or below a second voltage difference lower than the first specified voltage turns on the normally-on switching elements 31$u$, 31$v$, 31$w$. In this case, the boundary voltage for turning on/off the normally-on switching elements 31$u$, 31$v$, 31$w$ can be established. The other component parts are identical with those of the 14th embodiment.

Embodiment 16

Figure 16:
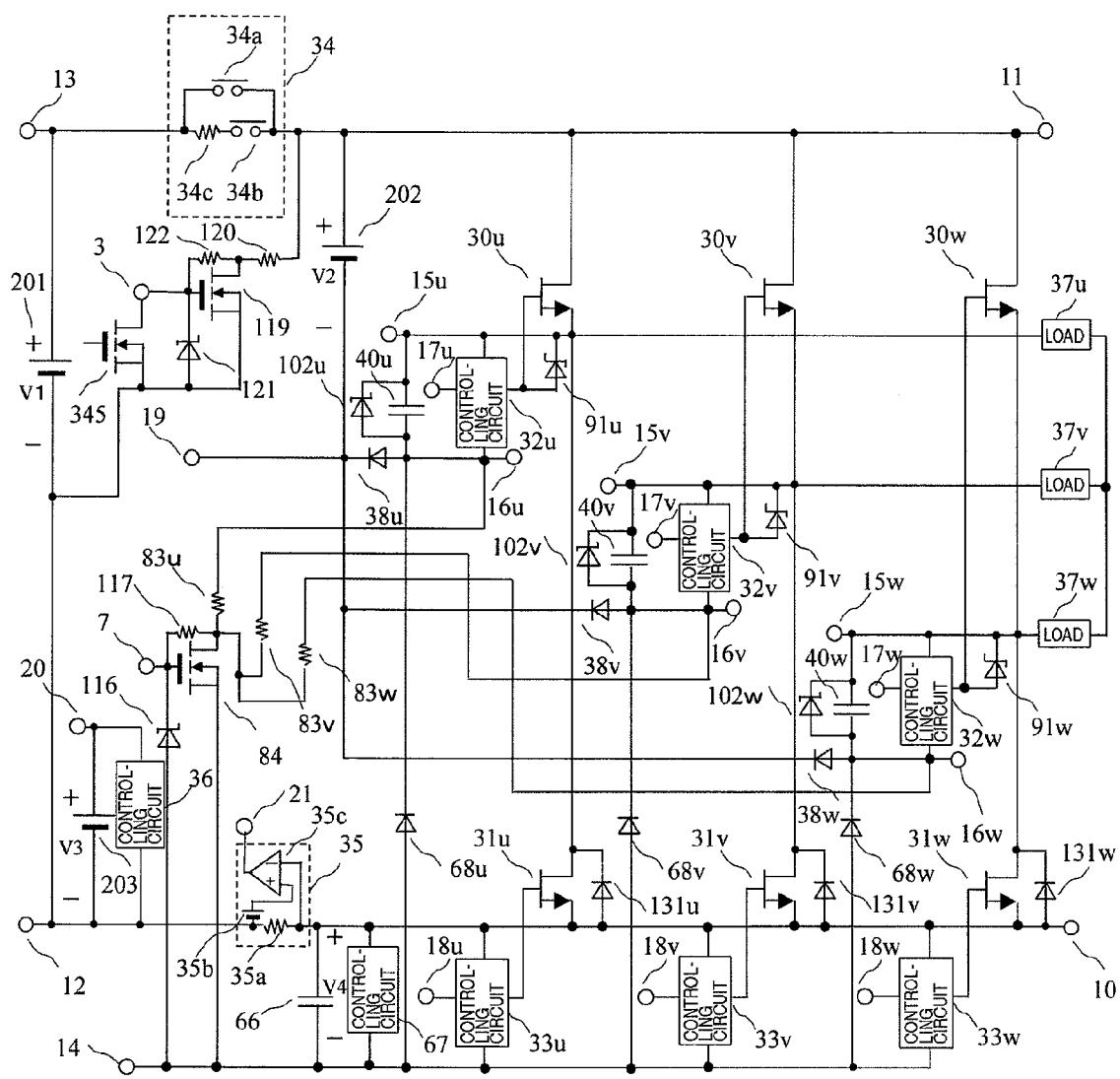
FIG. 16 is a diagram for explaining a semiconductor circuit according to a 16th embodiment.

FIG. 16 is a diagram for explaining the semiconductor circuit according to a 16th embodiment. According to this embodiment, the switching element 84 used for turning off the upper-arm switching elements 30$u$, 30$v$, 30$w$ in FIG. 14 is used not to forcibly turn off the upper-arm switching elements 30$u$, 30$v$, 30$w$ but to control the voltage of the low-voltage-side voltage terminals 16$u$, 16$v$, 16$w$ for the upper-arm controlling circuits downward to secure the desired power source voltage for the upper-arm controlling circuits. According to this embodiment, the desired power can be supplied to the controlling circuits 32$u$, 32$v$, 32$w$ even in the case where the power cannot be supplied to the controlling circuits 32$u$, 32$v$, 32$w$ from the power supply 202. Thus, the upper-arm switching elements can be effectively kept off for a long length of time.

According to this embodiment, the desired power can be supplied to the controlling circuits 32$u$, 32$v$, 32$w$ even in the case where power cannot be supplied from the power supply 202 to the controlling circuits 32$u$, 32$v$, 32$w$. Thus, all the upper-arm switching elements 30$u$, 30$v$, 30$w$ can be turned off, and the voltage of the high-voltage terminal 11 can be decreased by the current flowing in the upper-arm controlling circuits.

In this embodiment, the power source voltage for the upper-arm controlling circuits 32$u$, 32$v$, 32$w$ can be secured easily. In order to prevent the voltage of the high-voltage terminal 11 from sharply increasing or to shorten the time for decreasing the voltage of the high-voltage terminal 11 in case of a fault, the switching elements 30$u$, 30$v$, 30$w$, 31$u$, 31$v$, 31$w$ can be controlled in such a manner that the energy charged to the capacitor between the high-voltage terminal 11 and the reference voltage terminal 10 is discharged or the reverse current from the loads 37$u$, 37$v$, 37$w$ is released to the reference voltage side through the switching elements 30$u$, 30$v$, 30$w$, 31$u$, 31$v$, 31$w$.

In the case where the wide band gap semiconductor elements of such a material as SiC are used as the switching elements 30$u$, 30$v$, 30$w$, 31$u$, 31$v$, 31$w$, the maximum junction temperature can be increased as compared with the Si elements, and therefore, as described above, the voltage of the high-voltage terminal 11 can be safely reduced by supplying the current through the switching elements 30$u$, 30$v$, 30$w$, 31$u$, 31$v$, 31$w$ at the time of a fault.

Incidentally, also in this embodiment, like in the 15th embodiment, the switching element 84 or the switching element 119 can be replaced with a normally-on element, and the high-voltage switch 34 can be connected with a normally-on element for protection. The other component parts are identical with those in the 14th embodiment.

Embodiment 17

Figure 17:
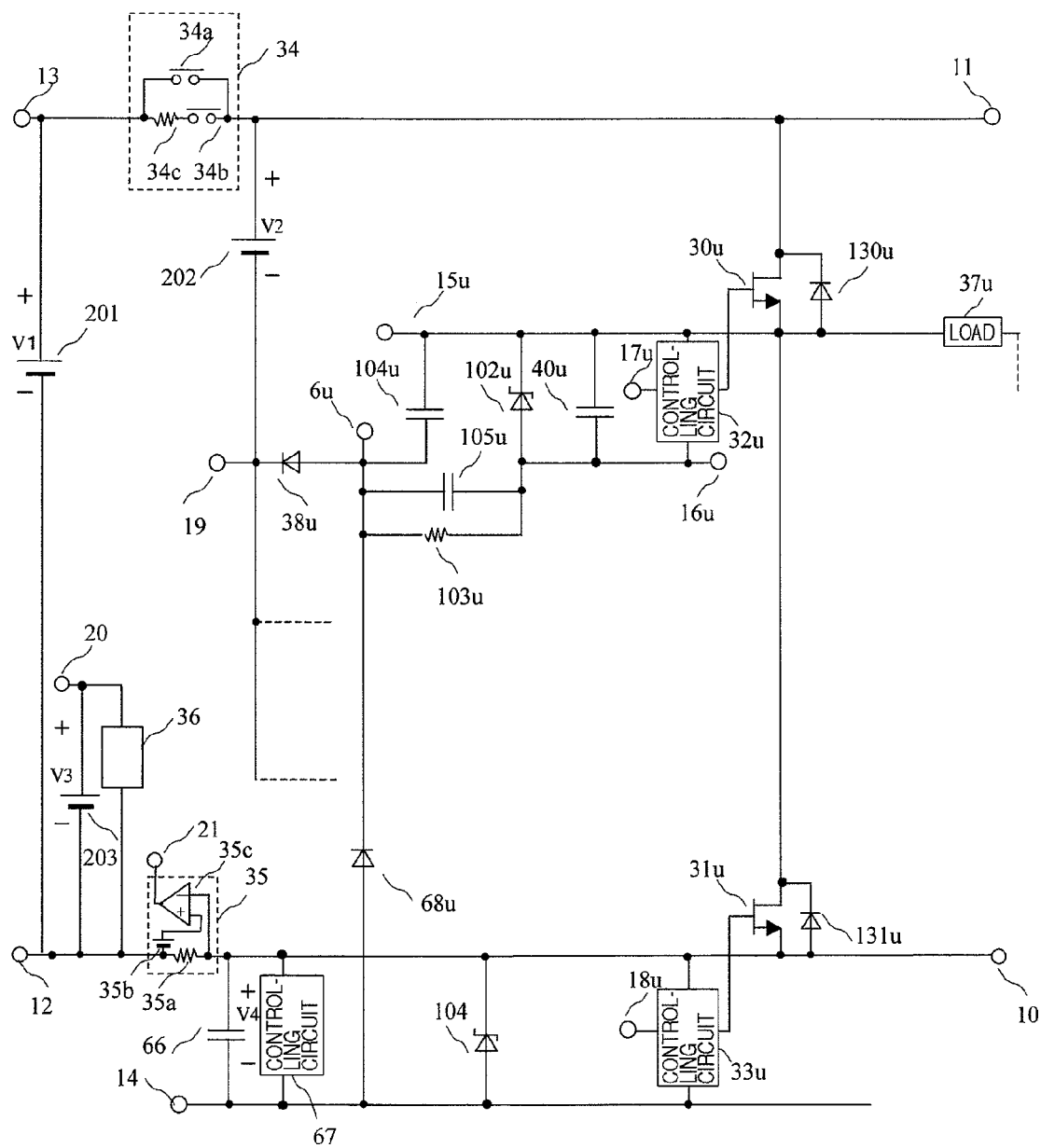
FIG. 17 is a diagram for explaining a semiconductor circuit according to a 17th embodiment.

FIG. 17 is a diagram for explaining the semiconductor circuit according to a 17th embodiment. Although only the U-phase circuit is shown in this embodiment, a similar circuit to the U-phase circuit can be employed also for V- and W-phase circuits. According to this embodiment, in the case where the high-voltage-side voltage terminal 15$u$ rises to a high potential, the voltage difference between the high-voltage-side voltage terminal 15$u$ and the power source voltage terminal 19 is applied not to the capacitor 40$u$ and the diode 38$u$ alone, but the voltage can be shared also between the low-voltage-side voltage terminal 16$u$ and the terminal 6$u$. In the case where the voltage of the high-voltage-side voltage terminal 15$u$ far exceeds the voltage of the high-voltage terminal 11 and tends to exceed the maximum power source voltage of the controlling circuit 32$u$ due to the parasitic inductance of the wiring or the like, therefore, the zener diode 102$u$ breaks down and the capacitor 105$u$ is charged. As a result, the energy charged to the capacitor 105$u$ of the controlling circuits, like the energy charged to the capacitor 40$u$, is used for charging the capacitor 66.

Even under the driving conditions with the voltage of the high-voltage-side voltage terminal 15$u$ far exceeding the voltage of the high-voltage terminal 11, therefore, the controlling circuit 32$u$ is protected from an overvoltage, and further, the energy charged to the capacitors can be effectively used. Further, in the case where excessive energy is charged to the capacitor, the voltage V2 of the power supply 202 can be reduced and therefore the total power consumption reduced. In the case where the voltage required for the controlling circuits cannot be secured, on the other hand, the voltage V2 of the power supply 202 is controlled upward. As shown in FIG. 3, for example, the voltage V2 of the power supply 202 can be controlled by controlling the primary side current of the transformer. Also, under the driving conditions with the voltage of the high-voltage-side voltage terminal 15$u$ far exceeding the voltage of the high-voltage terminal 11 all the time, the power supply 202 may be controlled to a negative voltage, i.e. the voltage of the power source voltage terminal 19 may be controlled upward to exceed the voltage of the high-voltage terminal 11. For this purpose, the power supply 202 may be an up/down converter.

Incidentally, in the case where the capacitor 66 is not charged by the capacitor 105$u$, the capacitor 105$u$ is not required. Also, according to this embodiment, a capacitor 104$u$ is interposed between the high-voltage-side voltage terminal 15$u$ and the terminal 6$u$, and the capacitor 66 can be charged also from the capacitor 104*u*. The resistor 103*u* is used with the power supply 202 to set the power source voltage of the control circuit 32*u* to substantially the same level as the voltage of the power supply 202. Nevertheless, the resistor 103*u* may be replaced by a switching element. Also, since the voltage of the capacitor 104*u* and the capacitor 66 can be discharged by the resistor 103*u*, the rate at which the voltage of the high-voltage-side voltage terminal 15*u* increases can be suppressed each time the same voltage tends to exceed the voltage of the high-voltage terminal 11. As a result, the soft switching operation can be performed with the rapid switching operation. The diode 68*u*, though connected to the terminal 6*u* in this embodiment, may alternatively be connected to the low-voltage-side voltage terminal 16*u*. The other points are similar to those of the fifth embodiment.

Embodiment 18

Figure 18:
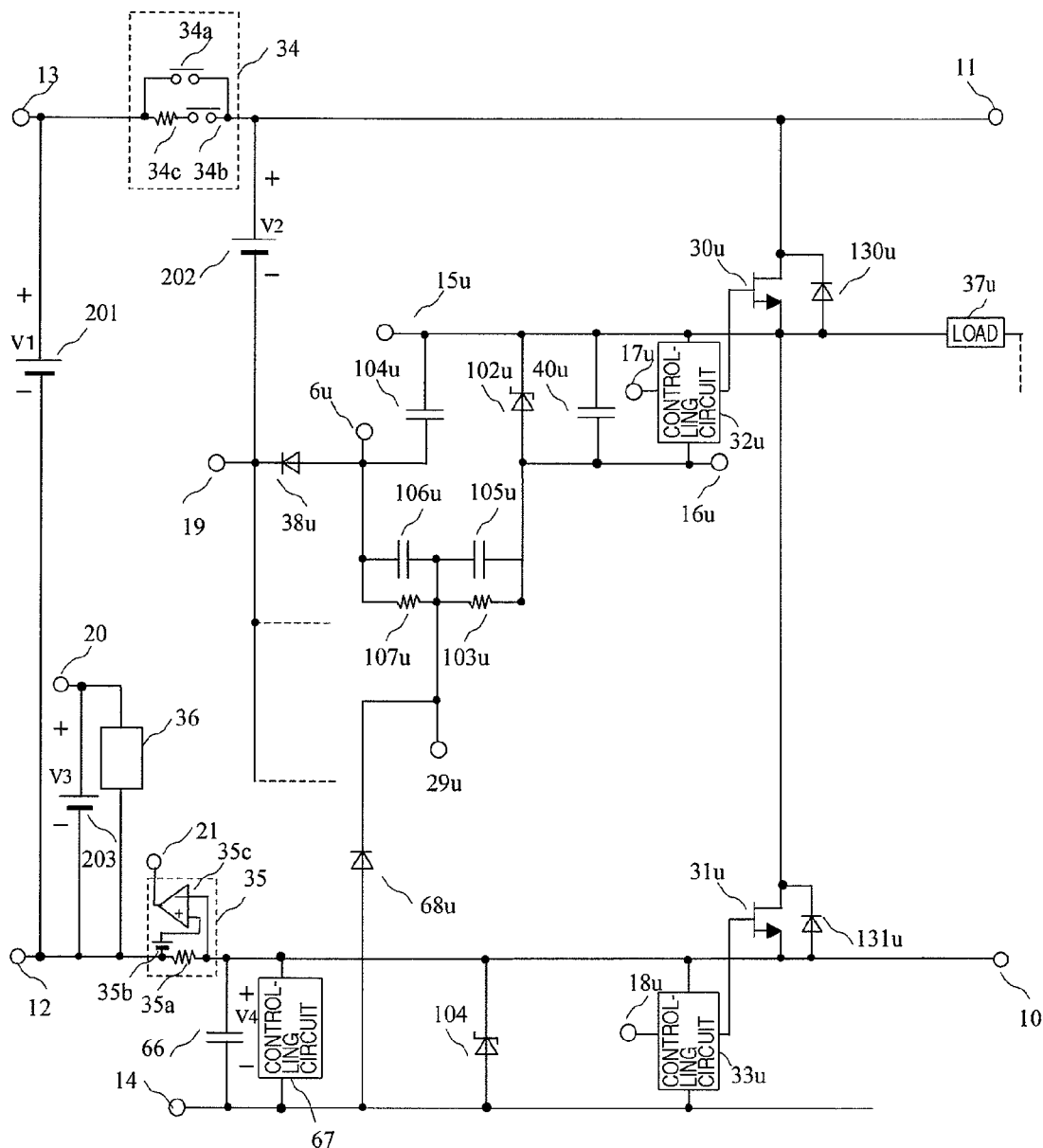
FIG. 18 is a diagram for explaining a semiconductor circuit according to an 18th embodiment.

FIG. 18 is a diagram for explaining the semiconductor circuit according to an 18th embodiment. According to this embodiment, the resistor 103*u* and the capacitor 107*u* of FIG. 17 are divided by a terminal 29*u*, and a capacitor 106*u* and a resistor 107*u* are added. In the embodiment of FIG. 15, the diode 68*u* is connected to the terminal 6*u* or the low-voltage-side voltage terminal 16*u*. According to the 18th embodiment, on the other hand, the voltage can be set to an intermediate level between the terminal 6*u* and the low-voltage-side voltage terminal 16*u*, and therefore, as compared with the connection of the diode 68*u* to the low-voltage-side voltage terminal 16*u*, the power source voltage drop of the control circuit 32*u* due to the charging of the capacitor 66 can be suppressed. Also, as compared with the case in which the diode 68*u* is connected to the terminal 6*u*, the maximum power source voltage instantaneously applied to the controlling circuit 33*u* can be suppressed. The other component parts are identical with those of the 16th Embodiment.

Embodiment 19

Figure 19:
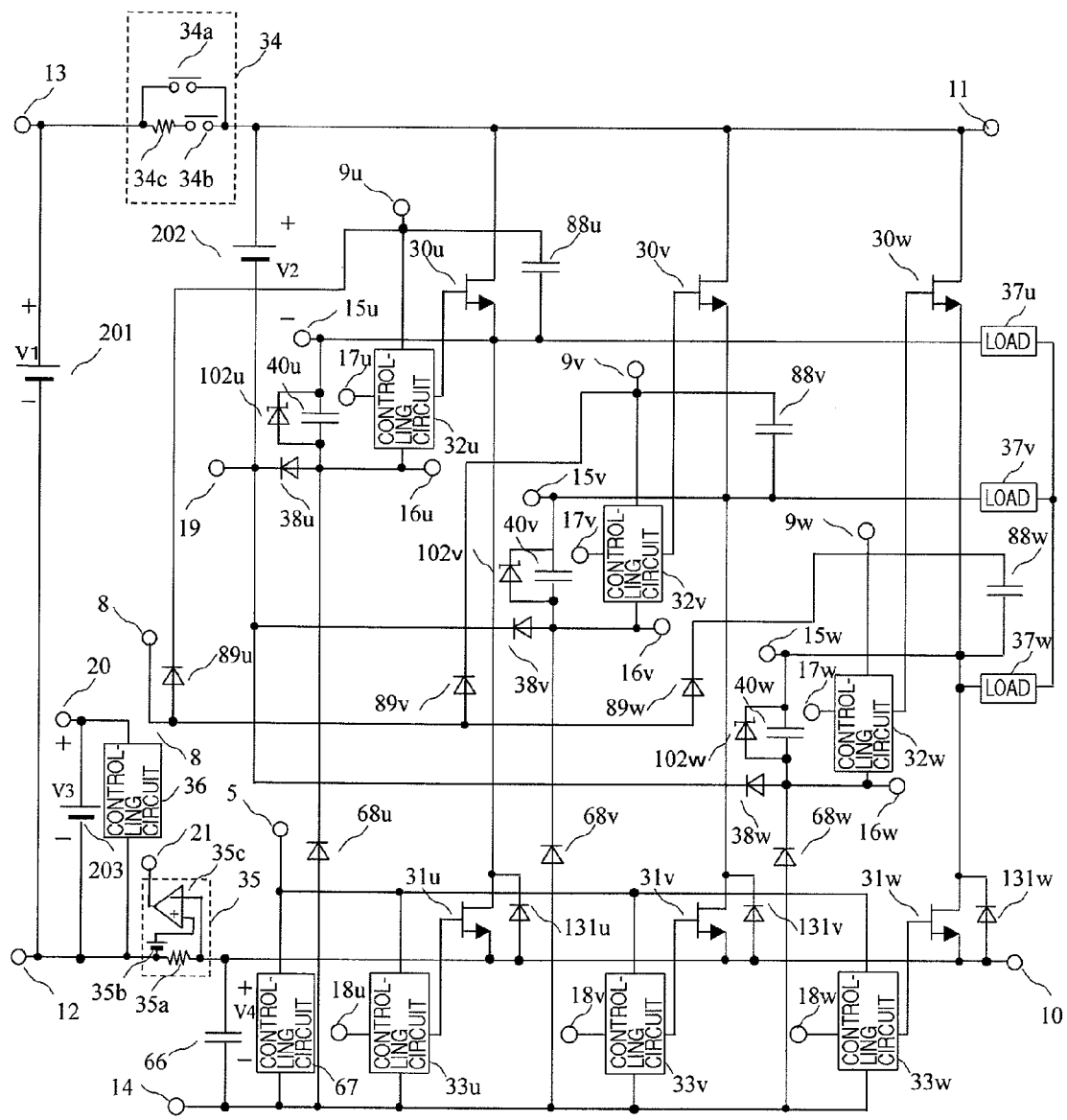
FIG. 19 is a diagram for explaining a semiconductor circuit according to a 19th embodiment.

FIG. 19 is a diagram for explaining the semiconductor circuit according to a 19th embodiment. According to this embodiment, the upper-arm switching elements 30*u*, 30*v*, 30*w*, 31*u*, 31*v*, 31*w* are of normally-off type. In the case of the normally-off elements, the drain current can be turned off by setting the gate-source voltage to zero. In the case where the rapid turning off of the gate voltage sharply increases the drain-source voltage, however, a positive voltage is applied between gate and source through the drain-gate capacitance. In the case where the threshold voltage is as low as not higher than about 3 V, therefore, the erroneous turning on may increase the loss. In order to positively turn off the normally-off element low in threshold voltage, therefore, the element is desirably driven in such a manner as to secure a sufficiently negative gate-source voltage.

According to this embodiment, high-voltage-side voltage terminals 9*u*, 9*v*, 9*w* are included to apply a positive gate-source voltage to use the circuit of FIG. 5 as a normally-off element. Also, according to this embodiment, the high-voltage-side voltage terminals 9*u*, 9*v*, 9*w* are adapted to generate a voltage through a bootstrap circuit using the capacitors 40*u*, 40*v*, 40*w* and the diodes 38*u*, 38*v*, 38*w*. Each time the lower-arm switching elements 31*u*, 31*v*, 31*w* are turned on, the capacitors 40*u*, 40*v*, 40*w* working as a power supply of the controlling circuit of the lower-arm switching elements 31*u*, 31*v*, 31*w* are charged from the terminal 8 through the diodes 38*u*, 38*v*, 38*w*. As a result, the power supply circuit can be reduced in size.

According to this embodiment, the terminals 5 and 8 are power supply terminals of about 3 V to 10 V and therefore can be integrated into a single common terminal. Also, according to this embodiment, with the approach of the voltage of the output terminal connected with the loads 37*u*, 37*v*, 37*w* to the voltage of the high-voltage terminal 11, the rising rate of the voltage is suppressed to charge the capacitors 40*u*, 40*v*, 40*w*. With the approach of the voltage of the output terminal to the voltage of the reference voltage terminal 10, on the other hand, the turn-off speed of the voltage is suppressed to charge the capacitors 66, 88*u*, 88*v*, 88*w*. As a result, the rapid switching operation and the soft switching operation can be performed at the same time, thereby making it possible to reduce the switching loss and noises at the same time.

This soft switching operation can be performed without using the capacitors 40*u*, 40*v*, 40*w* as power supply capacitors. Specifically, the upper-arm soft switching operation can be realized by connecting the capacitors 40*u*, 40*v*, 40*w* and the diodes 38*u*, 38*v*, 38*w* in series to the output terminal, and further, by providing a means for discharging the energy from the capacitors 40*u*, 40*v*, 40*w* and in this embodiment, the controlling circuits 32*u*, 32*v*, 32*w* and the controlling circuits 33*u*, 33*v*, 33*w*, 67. The lower-arm soft switching operation, on the other hand, can be realized by connecting the capacitors 88*u*, 88*v*, 88*w* and the diodes 89*u*, 89*v*, 89*w* in series to the output terminal, and further, by providing a means for discharging the energy from the capacitors 88*u*, 88*v*, 88*w* and in this embodiment, the controlling circuits 33*u*, 33*v*, 33*w*. The other points are identical with those of the fifth embodiment.

Embodiment 20

Figure 20:
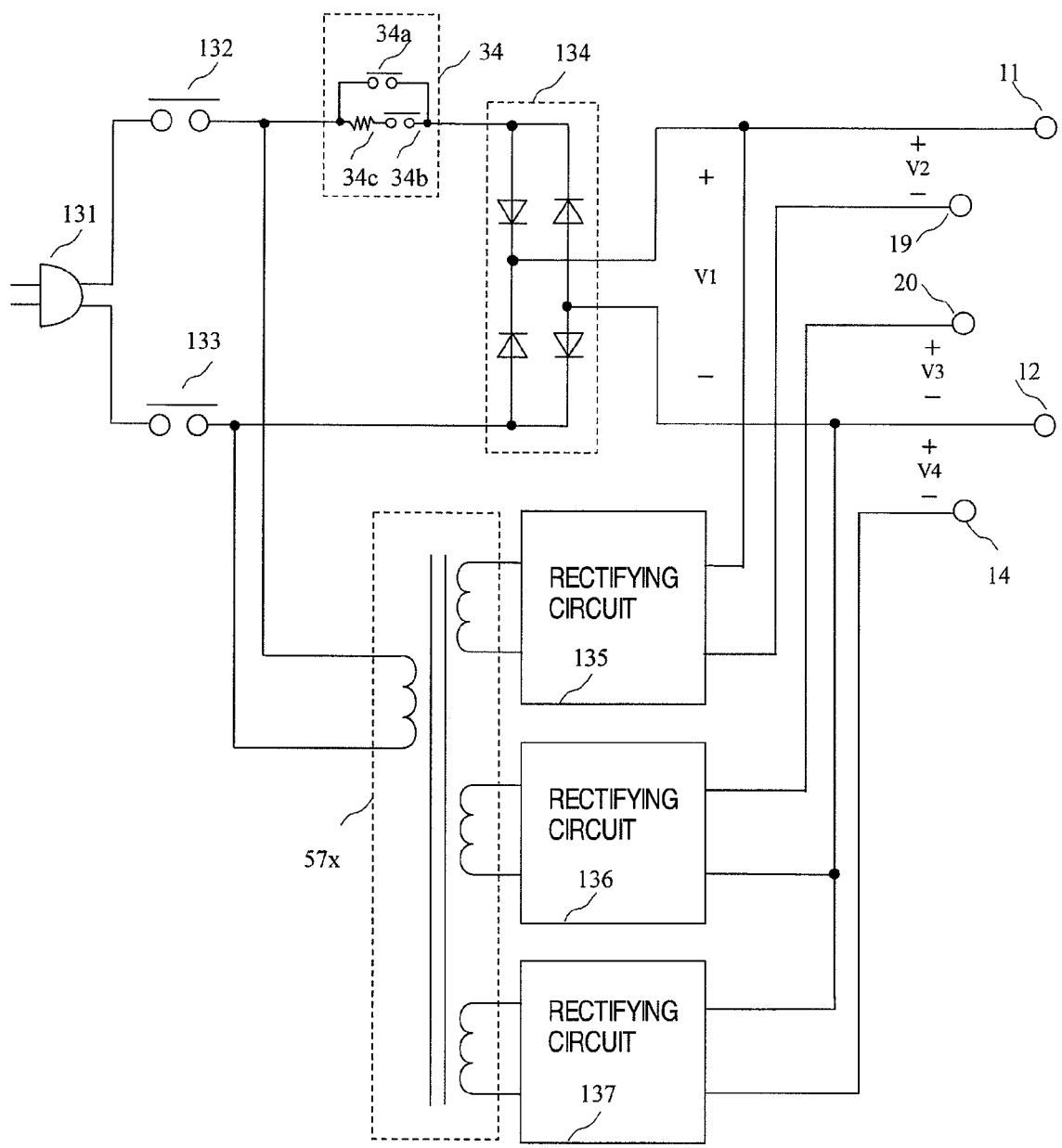
FIG. 20 is a diagram for explaining a semiconductor circuit according to a 20th embodiment.

FIG. 20 is a circuit diagram according to a 20th embodiment. According to this embodiment, a high-voltage switch 34 is inserted on the primary side before AC-DC conversion. In FIG. 20, numeral 131 designates an AC power supply plug, numerals 132, 133 main switches, numeral 57*x* a transformer, and numerals 134, 135, 136, 137 rectifying circuits. According to this embodiment, as in the first embodiment, at the time of activation, the power supplies V2, V3, V4 for the controlling circuits are increased to not lower than a first reference voltage and the high-voltage switch 34 turns on the switch 34*b* thereby to reduce the inrush current, after which the switch 34*a* is turned on. In the case where the power supplies V2, V3, V4 for the controlling circuit are reduced to a level not higher than a second reference voltage lower than the first reference voltage, on the other hand, the time required for turning off the high-voltage switch 34 from the on state thereof is set to not longer than one half of the time required for fully turning on the high-voltage switch 34 from the off state thereof. As a result, a reliable control operation is realized without breaking the elements and the system even in the case where the switching elements are of normally-on type.

Embodiment 21

Figure 21:
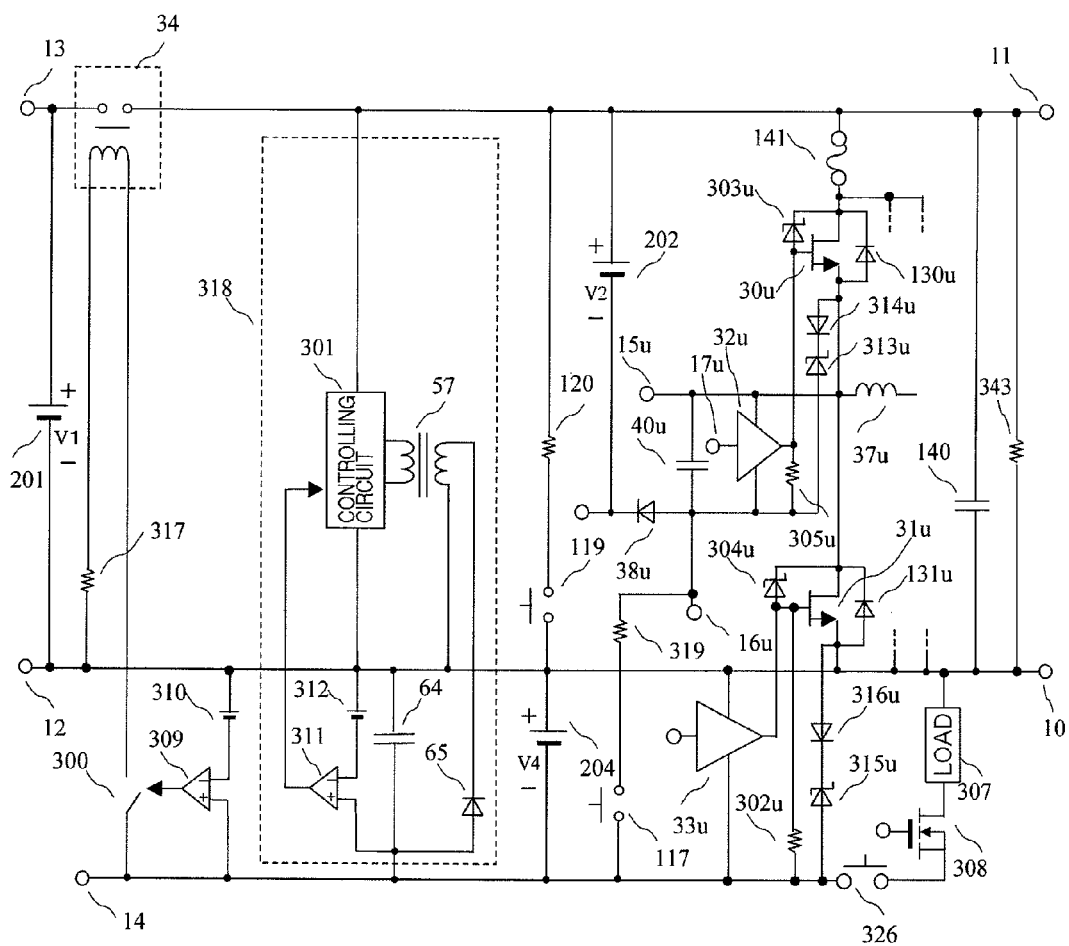
FIG. 21 is a diagram for explaining a semiconductor circuit according to a 21st embodiment.

FIG. 21 is a circuit diagram showing a 21st embodiment. In this embodiment, a negative power supply battery 204 is used to generate the negative voltage V4, where controlling circuit 301 is the primary side circuit of the DC/DC converter 318. Further, power is supplied to the negative power supply battery 204 through a DC/DC converter 318 from a positive power supply battery 201 of voltage V1 thereby to obtain the desired voltage. Also, even in the case where the power supply of the negative voltage V4 from the positive voltage side is stopped, the negative power supply battery 204 prevents the voltage V4 from sharply decreasing. Further, according to this embodiment, the gate terminal of the lower-arm normally-on semiconductor element 31u is connected to the negative power source voltage terminal 14 through the resistor 302u. Even in the case where the current stops being supplied to the control circuit 33u, therefore, the lower-arm normally-on semiconductor element 31u can be turned off or otherwise controlled to stop an overcurrent flow. This embodiment represents a case in which in order to improve the reliability, all the upper-arm normally-on semiconductor elements 30u can be turned off by turning on a normally-on switch 117 during a fault. Nevertheless, the semiconductor circuit can be protected by turning off all the upper-arm elements or all the lower-arm elements. Also, by opening the high-voltage switch 34 and turning on the switch 119, the energy charged in a large-capacity smoothing capacitor 140 can be rapidly discharged. As a result, the problem can be overcome in which the elements or the system is destroyed by an excessively large current which may flow to the reference voltage terminal 10 from the high-voltage terminal 11 due to the failure to turn off the normally-on semiconductor element 31u. Further, according to this embodiment, in order to prevent the excessively large discharge current from the smoothing capacitor 140 from breaking the power switching elements or the loads and improve the reliability, a switching element 141 such as a fuse for preventing an overcurrent may be arranged in the current path where the overcurrent is liable to flow.

In an application of this embodiment to a hybrid car, the positive power supply battery 201 constituting a main battery of about 290 V, for example, which, after being further increased in voltage depending on the prevailing situation, is connected to a motor generator and used as a power source for the motor. While the motor generator is operated as a power generator, on the other hand, a system configuration is employed to charge the main battery. Further, although the load 307 is a solenoid or the like controlled by the switching element 308, this embodiment uses the negative power supply 204 to supply power to auxiliary equipment. For automotive applications, the reference voltage terminal 10 is connected to the body at a voltage equivalent to the grounding potential. In the present-day automotive vehicles, a power supply positive with respect to the body is used as the power supply for auxiliary equipment, and therefore, the high side switch configuration is employed to connect a load to the body for safety. Thus, the use of a n-channel element in which a low on-resistance is easily realized as compared with a p-channel element complicates the driving circuit. According to this embodiment, in contrast, a low-side switch configuration can be employed in which even with the circuit configuration having a load 307 connected to the body to secure safety, the n-channel element 308 having a low on-resistance as a switching element can be realized with a simple driving circuit. Incidentally, in order to secure the compatibility with the conventional system, the voltage of the negative power supply battery 204 is desirably set to the order of 12 V or 36 V. Although a fuse can be used in place of the switch 326, a configuration can be designed in which the negative power supply battery 204 and the circuit supplied by the particular battery can be separated from each other as required. Each of the diodes 303u, 304u arranged between gate and drain is intended as an over voltage protection diode for protection against an overvoltage. In the case where an overvoltage is applied between the drain and source of the switching elements 30u, 31u, the switching elements 30u, 31u are turned on thereby to prevent the high-voltage terminal 11 from increasing excessively in voltage. In the case where the switching elements 30u, 31u are normally-on JFET, only one diode may be used for each element. In the case where the switching elements 30u, 31u are of normally-off type, on the other hand, the diodes 303u and 304u connected in series in opposite directions are required.

Embodiment 22

Figure 22:
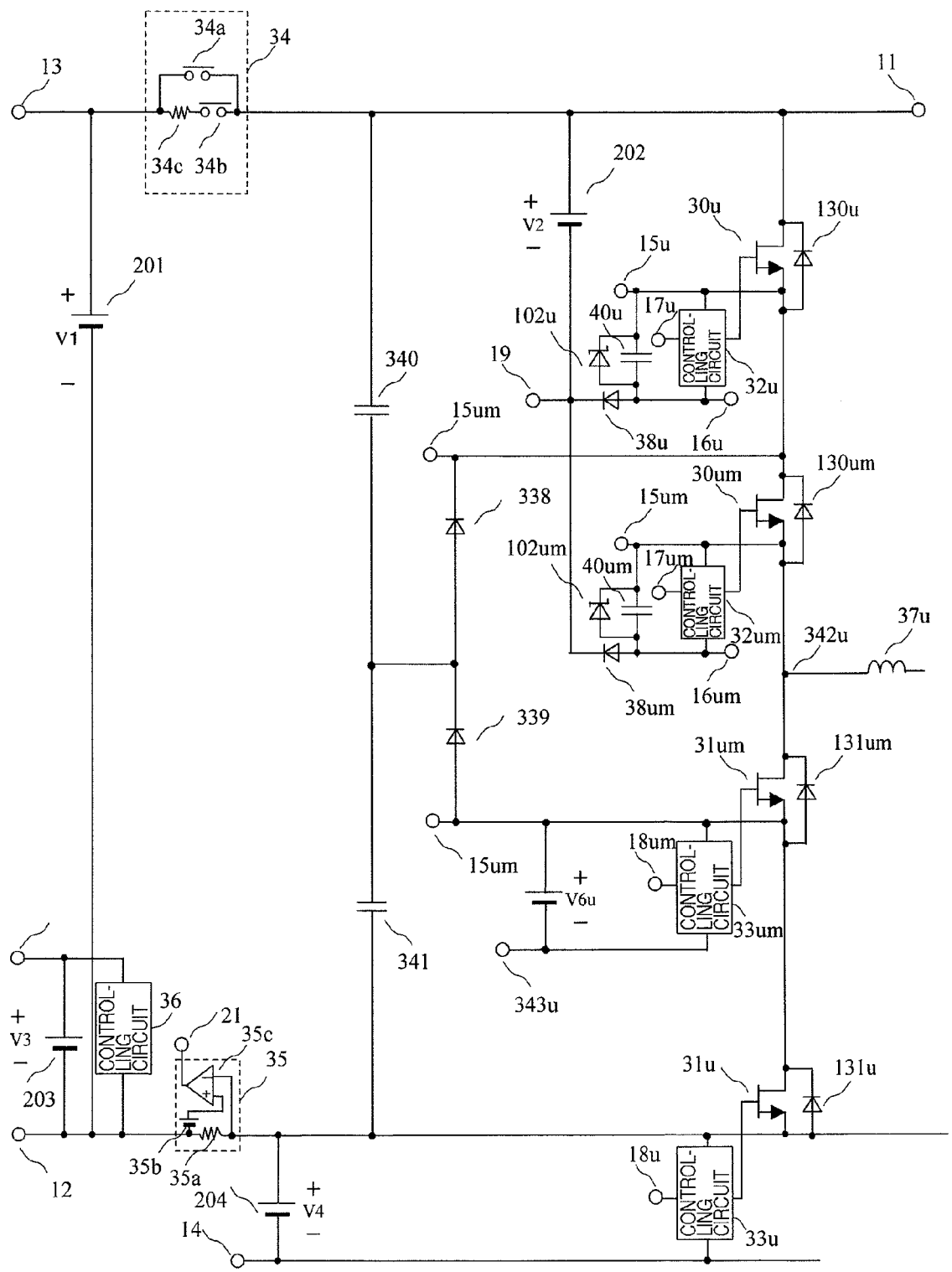
FIG. 22 is a diagram for explaining a semiconductor circuit according to a 22nd embodiment.

FIG. 22 is a circuit diagram according to a 22nd embodiment. This embodiment represents a case using a 3-level inverter, in which only the U-phase circuit is shown for the reason of the limited page space. An output terminal 342u assumes a low voltage in the case where only the switching elements 31u, 31um turn on, a middle voltage in the case where only the switching elements 31um, 30um turn on, and a high voltage in the case where only the switching elements 30u, 30um turn on. According to this embodiment, the power supply 202 is shared as a control power supply of the upper-arm switching elements 31um, 30um. In the case where both the upper-arm switching elements 31um, 30um turn on, capacitors 40u, 40um used as power supplies can be charged through diodes 38u, 38um to about the value of V2. This configuration, like the configuration explained in the first embodiment, can actually reduce the number of upper-arm power supplies.

Embodiment 23

Figure 23:
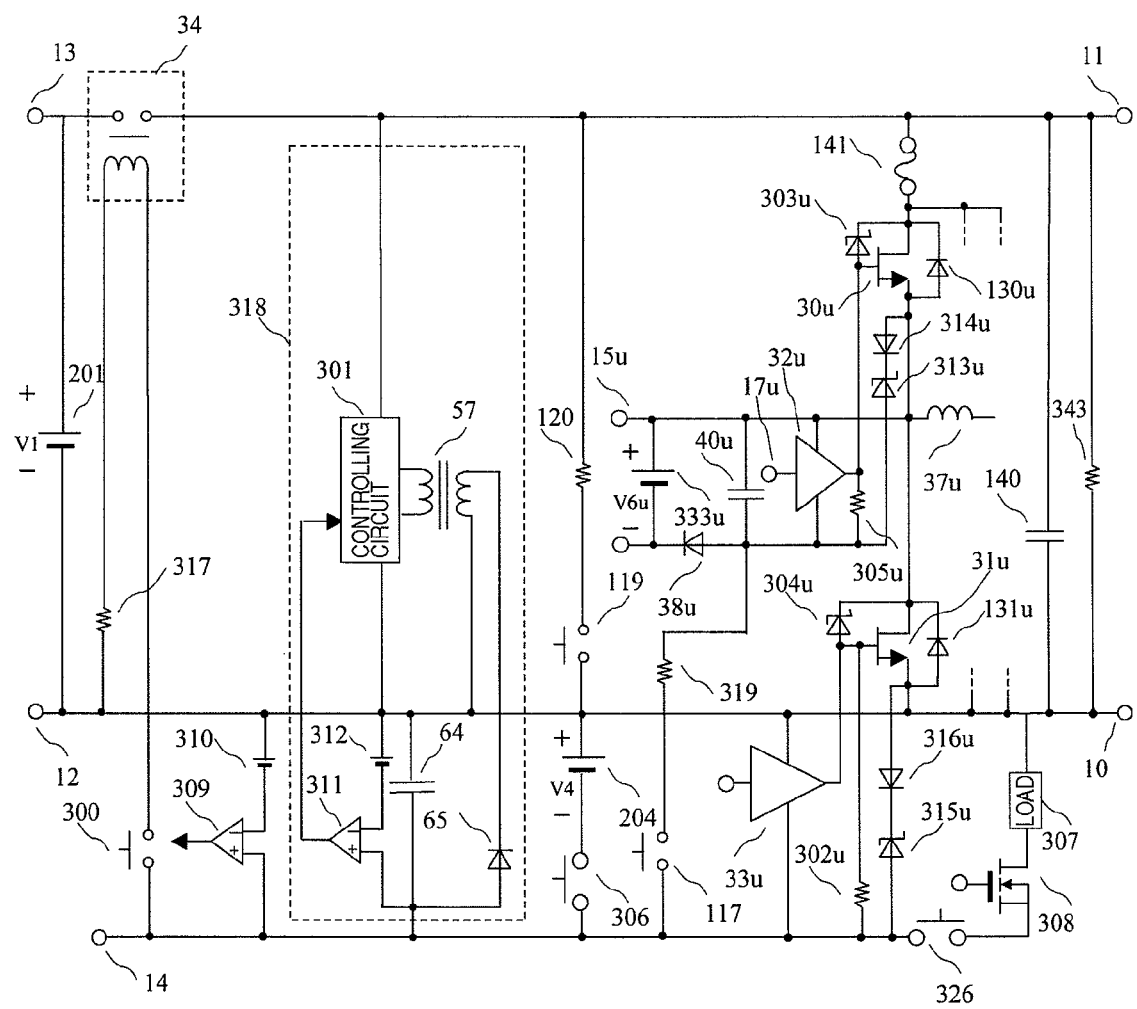
FIG. 23 is a diagram for explaining a semiconductor circuit according to a 23rd embodiment.

FIG. 23 is a circuit diagram showing a 23rd embodiment. This embodiment represents a case in which a normal floating power supply V6u is used as power supplies for the controlling circuits of the upper-arm switching elements. Another difference lies in that a switching element 306 such as a relay is interposed between the negative power supply terminal 14 and the negative power supply battery 204 for the circuit of the 21st embodiment shown in FIG. 21. The 21st embodiment has a circuit configuration in which a voltage is constantly applied between gate and source of the normally-on semiconductor element 31u. In the 23rd embodiment, on the other hand, a negative voltage is applied between gate and source to turn off the normally-on semiconductor element 31u only in the case where the switching element 306 is turned on and negative power is applied to the lower-arm circuit. As a result, this embodiment is applicable also to an element whose reliability is deteriorated by an increased leak current upon protracted application of a reverse bias between gate and source of the normally-on semiconductor element 31u. The other component parts and effects are identical with those of the 21st embodiment.

Embodiment 24

Figure 24:
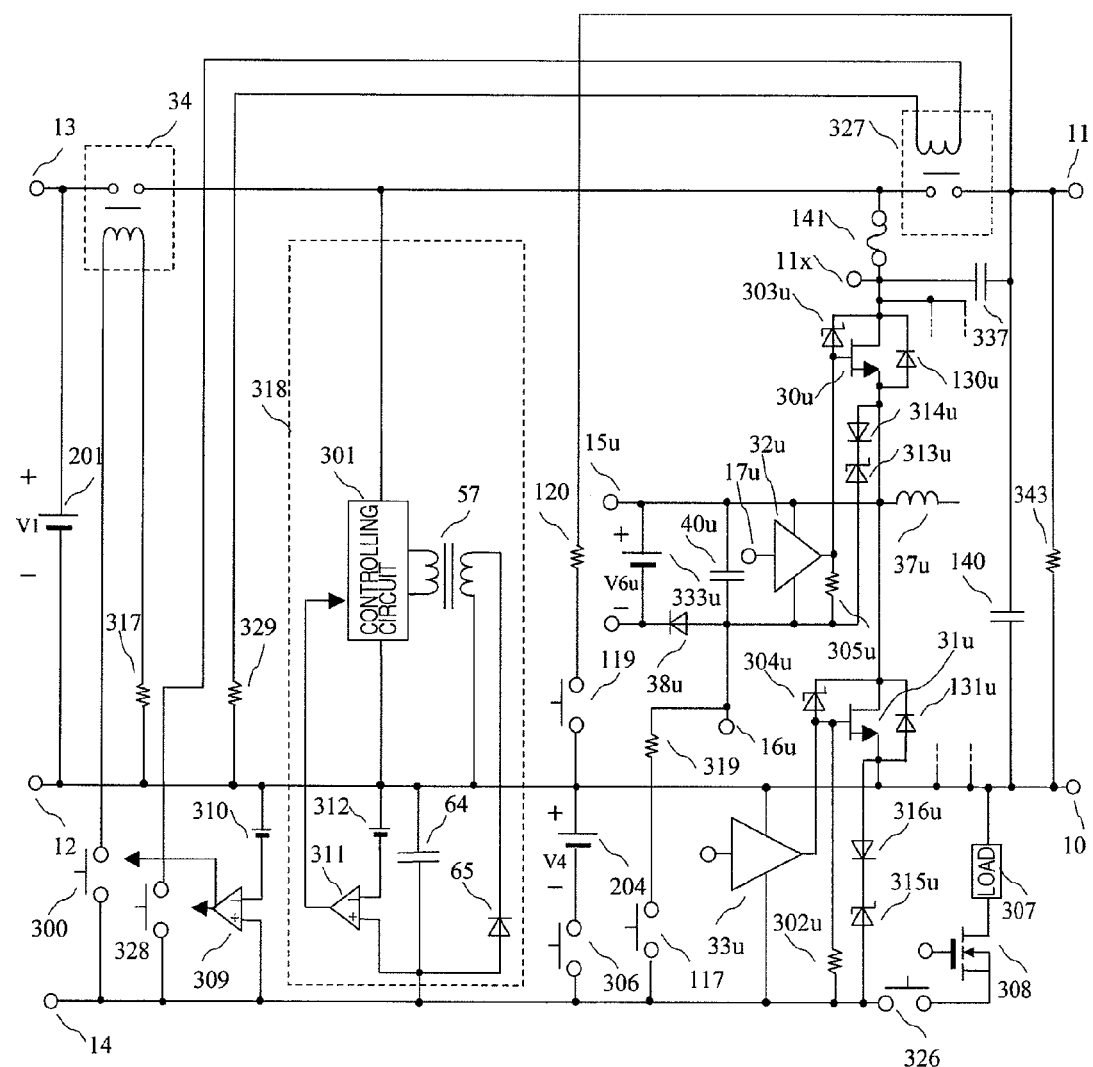
FIG. 24 is a diagram for explaining a semiconductor circuit according to a 24th embodiment.

FIG. 24 is a circuit diagram of this embodiment, and FIGS. 25A, 25B diagrams for explaining a method of controlling a main switch. According to this embodiment, in order to prevent the power switching elements 30u, 31u or the loads from being breaking down with the overcurrent flowing from the smoothing capacitor 140 due to a fault such as the failure to turn off the power switching elements 30u, 301, for example, a switch 327 is arranged on the path in which the overcurrent flows. The switch 327, like the switch 34, is of normally-off type and adapted to turn on when the negative power source voltage V4 assumes the desired value and turn off at the time of a fault when the negative power source voltage V4 decreases to not higher than a specified value and the power switching elements become almost impossible to control. Even in the case where the power switching elements 30u, 31u cannot be turned off due to a power failure, a reduced discharge capacity or a disconnection, therefore, the power switching elements 30u, 31u and the loads are prevented from being broken down by an excessively large discharge current from the smoothing capacitor 140. Also, another advantage is that reactivation after overcoming the fault is easier than in the case where the fuse 141 is used. According to this embodiment, the fuse 141, though done without, is better kept included for an improved reliability in case of a possible fault which cannot be followed by the response speed of the switch 327. Also, at the time of the fault, the normally-on switch 119 is turned on in order to rapidly discharge the energy from the smoothing capacitor 140 through the resistor 120. By the way, after the power from the power supply 201 is stopped in normal operation, the smoothing capacitor 140 may be discharged comparatively slowly using only a shunt resistor 343 of a high resistance value arranged in parallel to the smoothing capacitor 140. A high-speed mechanical relay may be used as the switch 327 in the case where the high-voltage switching elements 30u, 31u have a high load shorting strength such as the wide band gap semiconductor element. Nevertheless, a normally-off semiconductor switch using a high-speed wide band gap semiconductor having a high breakdown voltage, a low loss and a high response is a desirable choice. Also, the switch 327, like in the embodiment of FIG. 2, may have the function of inrush current prevention, and the switch 34 may be a normal switch having only the on/off function. At the time of a fault, the switch 327 is desirably turned off at the same rate as or at a higher rate than the switch 34.

The capacitor 337 is provided to suppress the effect of the parasitic impedance which otherwise might be increased by the addition of the switch 327 or a fuse. The capacitor 337 may have a sufficiently low breakdown voltage but desirably has a sufficiently larger capacitance than the smoothing capacitor 140. Incidentally, the capacitor 337 may be inserted as a second smoothing capacitor between the terminal 11x and the reference voltage terminal 10. In such a case, the capacitance of this capacitor is desirably so small that an overcurrent due to the second smoothing capacitor poses no problem.

The switch 327, though arranged between the smoothing capacitor 140 and the upper-arm power switching element 30u according to this embodiment, may alternatively be inserted between the smoothing capacitor 140 and the lower-arm power switching element 31u or between the upper-arm power switching element 30u and the lower-arm power switching element 31u.

Also, this embodiment represents a circuit adapted to operate upon determination of the simple decrease in the negative power supply V4 as a fault. This embodiment, like the embodiments described above, however, may be so configured that a fault determination is made by the power source voltage V6 of the upper-arm controlling circuits or by the current detecting circuit of the main circuit as shown in FIG. 1 or, for the whole circuits, by monitoring all the detecting circuits and finding a fault in at least one of them.

Embodiment 25

Figure 26:
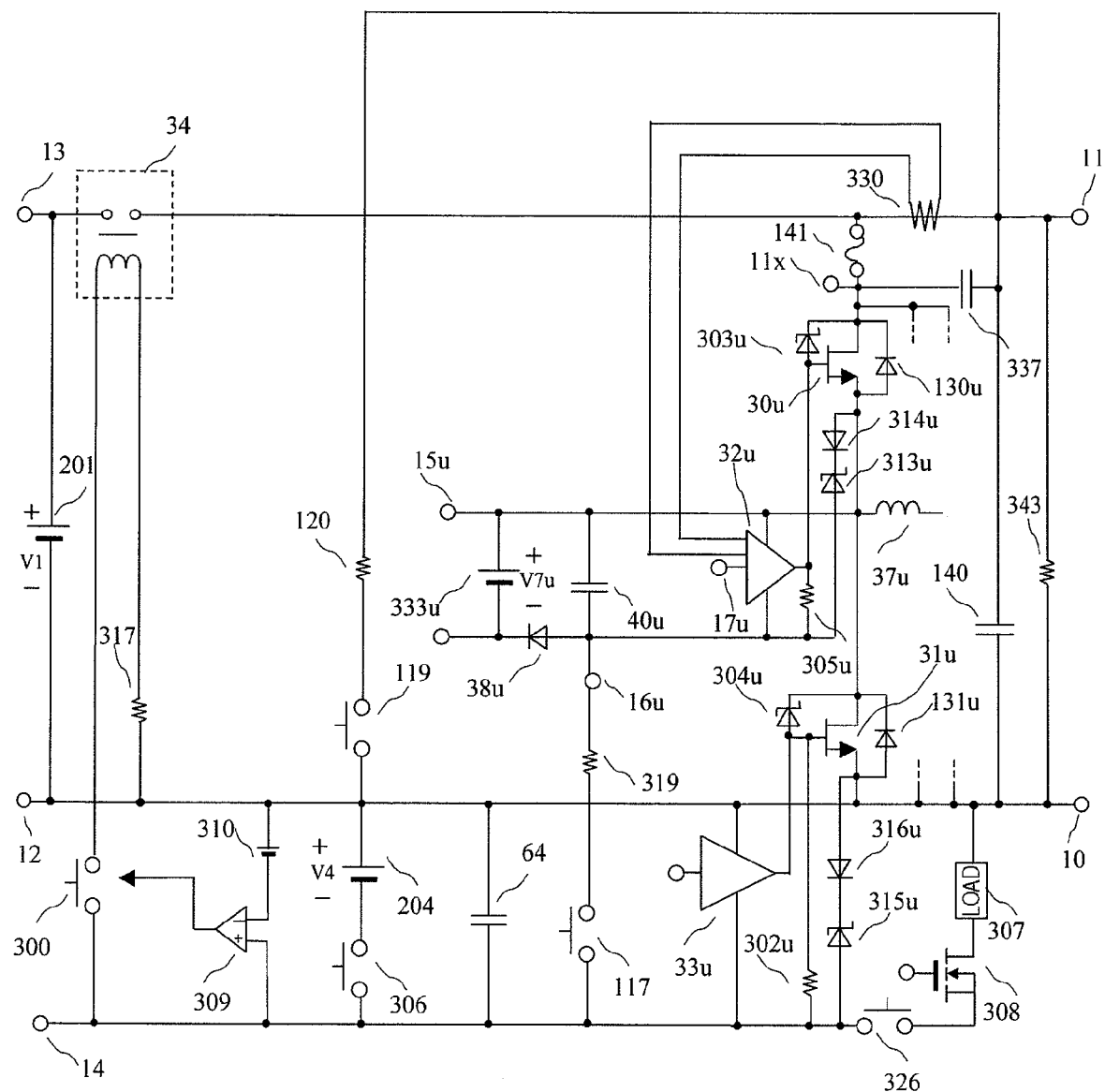
FIG. 26 is a diagram for explaining a method of controlling a main switch according to the 25th embodiment.

FIG. 26 is a circuit diagram showing a 25th embodiment. According to this embodiment, a current converter 330 is used and the sharp increase in the current in the switching elements 30u, 31u and the main circuit is detected taking advantage of the induction effect, the switching element 30u, etc. is turned off or an overcurrent therein controlled, and during this period, the switch 119 is turned on so that the energy charged to the smoothing capacitor 140 is discharged to reduce the voltage of the voltage terminal 11, thereby preventing the breakdown of the switching elements 30u, 31u and the load 37u. Incidentally, by increasing the coupling coefficient of the current converter 330, the power required to turn off or increase the impedance of the switching element 30u, etc. may be provided by a transient large current flowing in the main circuit. This embodiment represents a case in which the switch 327 shown in FIG. 24 is omitted. Nevertheless, the switch 327 may be included. Due to the limited space of the page, the DC/DC converter 318 is not described in this embodiment. The other component parts are identical with those of the 24th embodiment.

Embodiment 26

Figure 27:
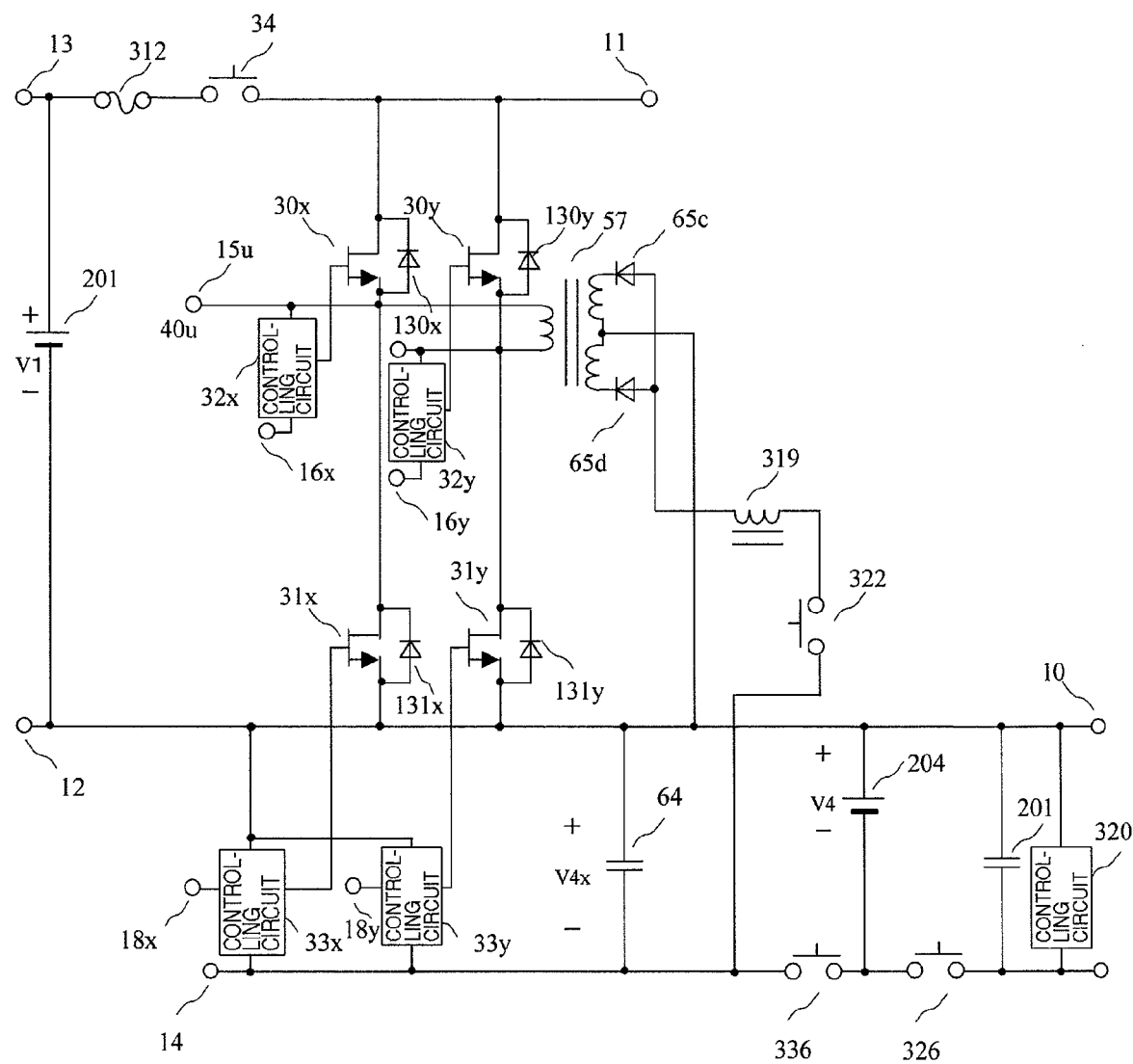
FIG. 27 is a diagram for explaining a semiconductor circuit according to a 26th embodiment.

FIG. 27 is a circuit diagram showing a 26th embodiment. In the drawing, numeral 320 shows a controlling circuit which can be used for auxiliary equipment in a hybrid car and so on. This embodiment represents a specific example of the circuit configuration of the DC/DC converter 318 shown in FIG. 21. According to this embodiment, normally-on switching elements 30x, 30y, 31x, 31y having a wide band gap semiconductor element are used as the high-voltage side switching elements of the DC/DC converter 318 thereby to realize a low-loss circuit. Also, the control circuits 33x, 33y for driving the switching elements 30x, 30y, 31x, 31y are driven by the negative power source voltage V4 generated by the DC/DC converter 318. The switches 322, 326, 336, though provided for separating the circuits from each other, are not necessarily be all required but may be replaced with a fuse.

Embodiment 27

Figure 28:
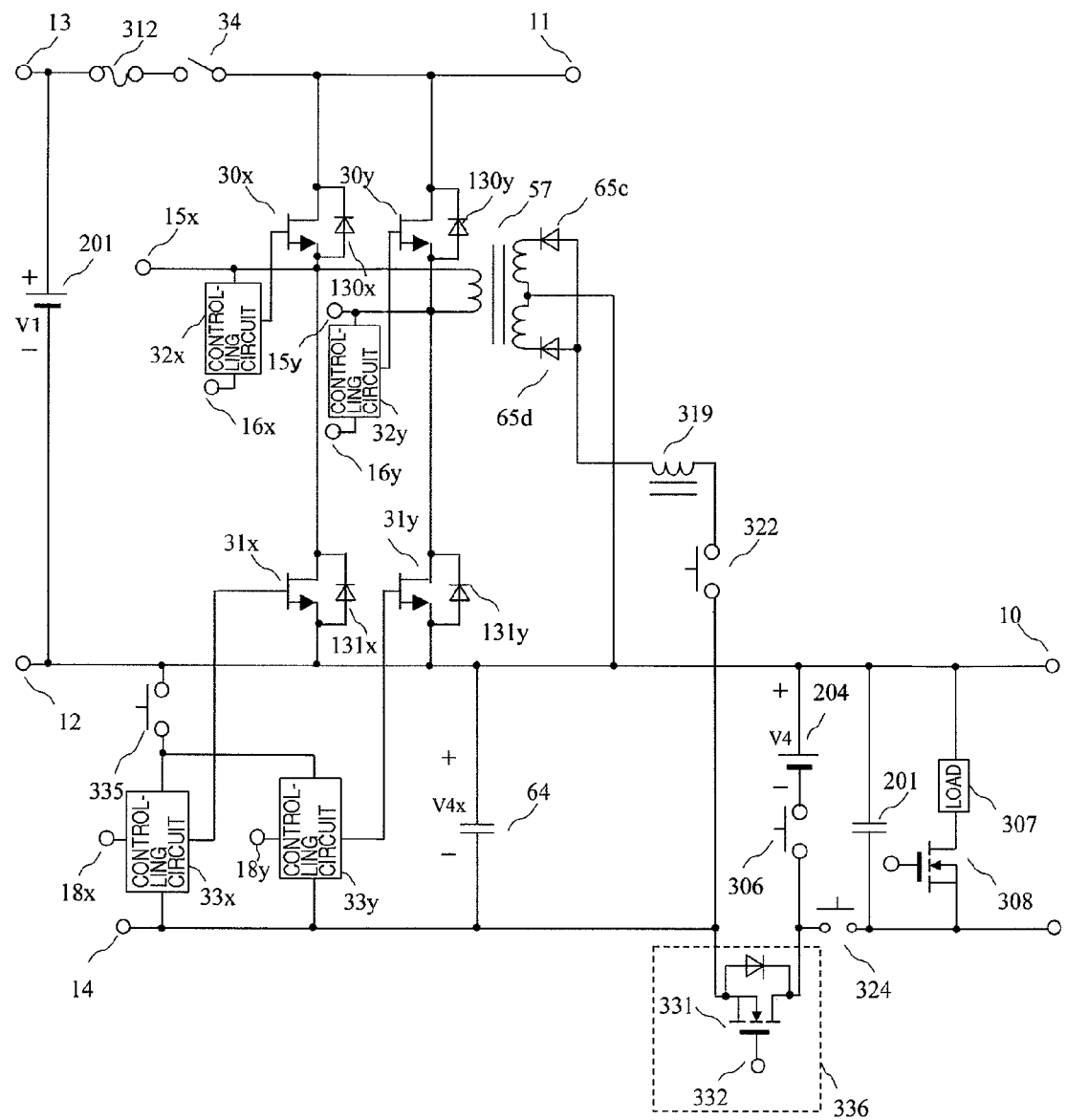
FIG. 28 is a diagram for explaining a semiconductor circuit according to a 27th embodiment.

FIG. 28 shows a circuit diagram of a 27th embodiment. This embodiment represents a case in which a switch 336 is interposed between the power supply 204 for the negative voltage V4 such as a battery and the circuits 33x, 33y for controlling the normally-on switching elements. The switch 336 may be a diode having an anode on the side near to the controlling circuits 33x, 33y and a cathode near to the power supply 204. According to this embodiment, however, a normally-off MOSFET 331 with the body thereof connected to the source is used to reduce the loss of normal operation. The MOSFET 331, during the off state, operates as a diode having an anode near to the controlling circuits 33x, 33y and a cathode near to the power supply 204 as shown. Even in the case where the power source voltage V4x of the controlling circuits of the normally-on switching elements tends to decrease, therefore, the diode is forward biased and therefore, a voltage substantially equal to the voltage V4 of the battery 204 is secured. Further, according to this embodiment, the like in the normally-off switch 75 according to the eighth and ninth embodiments described above, a normally-off switch 335 is inserted between the high-voltage terminal of the circuits 33x, 33y for controlling the lower-arm normally-on switching elements 31x, 31y and the reference voltage terminal 10. By turning off the switch 335, the switching elements 31x, 31y can be turned off, and therefore, a negative voltage continues to be applied between gate and source of the switching elements 31x, 31y thereby making it possible to hold the off state or the high impedance state of the switching elements 31x, 31y. Also, in the case of a fault of rapid decrease in the voltage V4 across the battery 204, the MOSFET 331 is turned off. Thus, the voltage V4x charged to the capacitor 64 is held, and the switching elements 30x, 30y, 31x, 31y can be kept off or in the state of a limited current. In this way, during the period of time when the switching elements are off or no excessively large current flows therein, the energy of the smoothing capacitor 114 is discharged by the switch 119 shown in FIG. 21, and the voltage of the high-voltage terminal 11 is reduced to or below a safety level. As a result, the reliability of the circuit using the high-voltage normally-on switching elements is improved.

A fuse 312 is provided for solving the problem that the switch 34 fails to respond normally or has a slow response.

Embodiment 28

Figure 29:
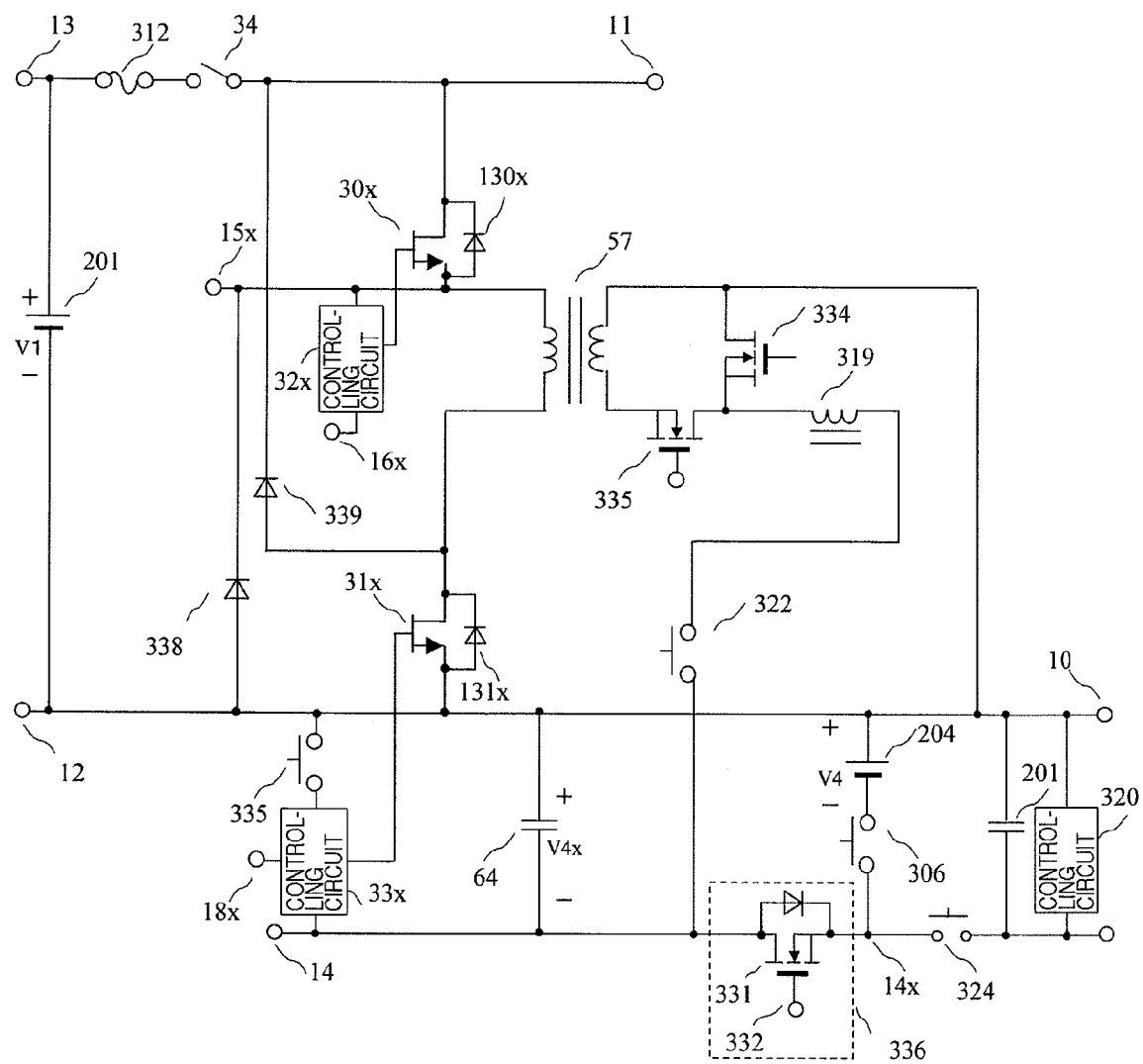
FIG. 29 is a diagram for explaining a semiconductor circuit according to a 28th embodiment.

FIG. 29 is a circuit diagram showing a 28th embodiment. This embodiment represents a case in which a bidirectional DC/DC converter is employed as the DC/DC converter in the circuit of the 27th embodiment shown in FIG. 28. Specifically, power is supplied to the negative power supply battery 204 from a positive power supply 201 on the one hand, and in the case where the voltage across the battery used as the positive power supply 201 drops. the positive power supply battery 201 can be charged from the negative power supply battery 204 on the other hand. In an application of this embodiment to electric vehicles, at least the engine can be started with the energy stored in the auxiliary battery 204 even in the case where the power supply 201 providing a main battery is almost exhausted, and therefore, the reliability of the automotive vehicles is improved.

Embodiment 29

Figure 30:
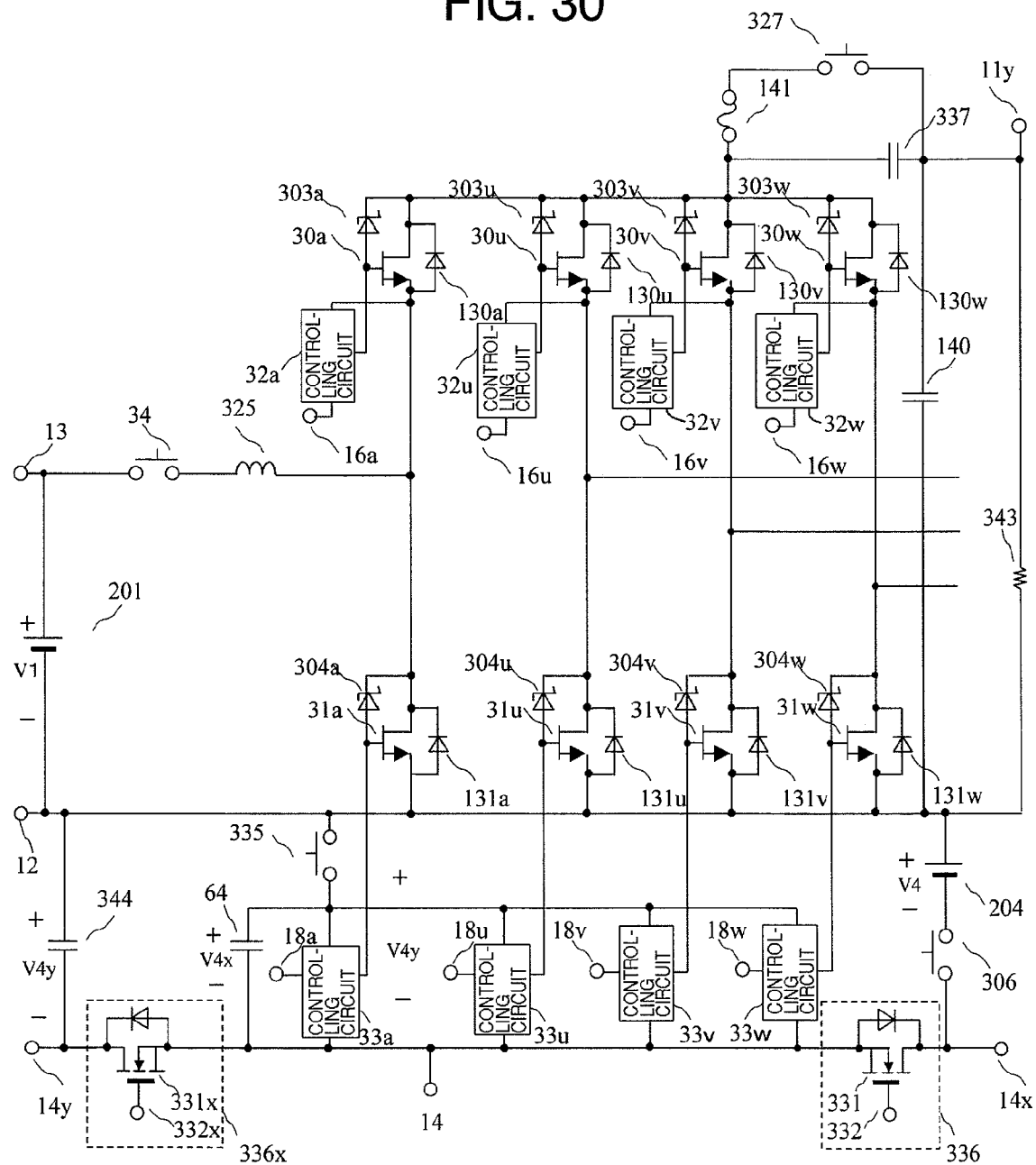
FIG. 30 is a diagram for explaining a semiconductor circuit according to a 29th embodiment.

FIG. 30 is a circuit diagram showing a 29th embodiment. This embodiment concerns a case in which a hybrid car or the like requires a voltage higher than the high-voltage power supply 201 constituting a main battery. The switching elements 30a, 31a operate as a converter to increase the voltage from, say, 288 V to 650 V, and the switching elements 30u, 30v, 30w, 31u, 31v, 31w are used as the elements of an inverter circuit. The feature of this embodiment lies in that a switching element of the wide band gap semiconductor or especially, a normally-on semiconductor element liable to be reduced in on-resistance is used as the power element of the high-voltage circuits. As in other embodiments, even in the case where the normally-on semiconductor elements are used as high-voltage switching elements, the presence of the power supply V4 for negative voltage makes it possible to turn off or make a high impedance of all the lower-arm normally-on switching elements 31a, 31u, 31v, 31w. Also, even during a fault of the rapid decrease in the voltage of the power supply V4, the sharp voltage drop at the voltage terminal 14 is prevented by turning off the switch 336. As a result, while suppressing the current flowing in the normally-on semiconductor elements 31a, 31u, 31v, 31w, 30a, 30u, 30v, 30w to a level not breaking the same elements and the system, the energy in the smoothing capacitor 140 can be discharged safely through the resistor 343 and the normally-on semiconductor elements 31a, 31u, 31v, 31w, 30a, 30u, 30v, 30w. Also, in the case where the voltage between the reference voltage terminal 12 and the negative voltage terminal 14 tends to decrease to such an extent as to jeopardize the normal operation of the controlling circuits 33a, 33u, 33v, 33w, the switch 335 is turned off, and a negative voltage is applied to the gate terminal of the normally-on semiconductor elements 31a, 31u, 31v for as long a period as possible during which the smoothing capacitor 140 can be discharged to a safe level.

According to this embodiment, a capacitor 344 and a switch 336x are further added. Even in the case of a fault such as the shorting of both the negative power supply batter 224 and the capacitor 64 for holding the negative voltage, therefore, the voltage terminal 14 can be kept at negative voltage for a longer time by the voltage V14y of the capacitor 344. The voltage V14y is charged through the switch 336x during the normal operation. According to this embodiment, the capacitor 64 is connected to the reference voltage terminal 12 only while the switch 335 is in on state, and therefore, in the case where the capacitor 64 develops a fault, the switch 335 is turned off and the voltage of the voltage terminal 14 can be easily held at negative level. By increasing the capacitance of the capacitor 344, like in the aforementioned embodiments, however, the voltage terminal 14 can be effectively held at negative voltage at the time of a fault of the capacitor 64 even in the case where the capacitor 64 is connected directly to the reference voltage terminal 12. In the case where the capacitor 344 develops a fault, the voltage terminal 14 is held at a negative voltage by turning off the switch 336. Although the switch 336 may be formed of only a diode, the use of the MOSFET switch can reduce the resistance of the switch 336x in normal state for a reduced loss. The other component parts are similar to those of the aforementioned embodiments.

Although this invention uses the normally-on switching element, the same configuration and effects can be obtained by using the quasi-on switching element in which the controlling voltages (gate voltages) of opposite polarities are required to be applied to the controlling terminals (gate terminals, etc.) when a high voltage is applied between the main electrodes (drain and source) in the case were the normally-on switching elements are turned off or increased in impedance with the control voltage (gate voltage) at zero.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor circuit comprising:
   a reference voltage terminal;
   a first power source voltage terminal higher in voltage than the reference voltage terminal;
   at least a set of output terminals arranged between the reference voltage terminal and the first power source voltage terminal;
   a plurality of first switching elements arranged between the output terminals and the first power source voltage terminal; and
   a plurality of first controlling circuits for controlling the first switching elements;
   wherein the first controlling circuits operate between the voltage of the plurality of high-voltage-side voltage terminals and the voltage of a plurality of low-voltage-side voltage terminals, respectively;
   wherein the voltage at the low-voltage-side voltage terminals is a negative voltage lower than the voltage at the source terminal of the first switching elements;
   wherein a plurality of first capacitors are arranged between the output terminals and a second power source voltage terminal; and
   wherein the voltage at the low-voltage-side voltage terminals is generated by the voltage charged to the first capacitors.

2. The semiconductor circuit according to claim 1, further comprising a plurality of first rectifying elements between the second power source voltage terminal and the first capacitors; and wherein the first capacitors are charged in the case where the voltage at the output terminals is higher than the voltage at the second power source voltage terminal.

3. The semiconductor circuit according to claim 1, further comprising at least a set of second switching elements and a plurality of second controlling circuits for controlling the second switching elements between the reference voltage terminal and the output terminals;
wherein the second controlling circuits operate between the voltage at the high-voltage-side voltage terminals and the voltage at a third voltage terminal providing the voltage at the low-voltage-side voltage terminals, and the voltage at the third voltage terminal is a negative voltage lower than the voltage at the reference voltage terminal.

4. The semiconductor circuit according to claim 3, further comprising a second capacitor inserted between the reference voltage terminal and the third voltage terminal;
wherein the second capacitor is charged from the first capacitors.

5. The semiconductor circuit according to claim 4, further comprising a plurality of second rectifying elements inserted between the first capacitors and the third voltage terminal;
wherein the second capacitor is charged from the first capacitors through the second rectifying elements.

6. The semiconductor circuit according to claim 4, wherein the second capacitor is charged by use of a step-down voltage circuit.

7. The semiconductor circuit according to claim 3, further comprising a switching element for cutting off current, the switching element being provided in series with at least one of the first switching elements and at least one of the second switching elements between the first power source voltage terminal and the reference voltage terminal.

8. The semiconductor circuit according to claim 7, wherein the switching element comprises a fuse member.

9. The semiconductor circuit according to claim 3, further comprising:
a smoothing capacitor provided in parallel with a set comprised of at least one of the first switching elements and at least one of the second switching elements, and
a switching element for cutting off current flowing from the smoothing capacitor to the set of the at least one first switching element and the at least one second switching element.

10. The semiconductor circuit according to claim 9, wherein the switching element comprises a fuse member.

11. The semiconductor circuit according to claim 3, further comprising a switch element provided between at least one of the low-voltage-side voltage terminals for turning off each of the first switching elements during a fault.

12. The semiconductor circuit according to claim 3, further comprising a smoothing capacitor provided between at least one of the first switching elements and at least one of the second switching elements respectively corresponding thereto for flowing an over-current during a fault in which said ones of the first and the second switching elements fail to be turned off, and another switching element connected to the smoothing capacitor and arranged to be turned-off during the fault.

13. The semiconductor circuit according to claim 1, wherein the voltage at the second power source voltage terminal is supplied by a power supply connected to the first power source voltage terminal.

14. The semiconductor circuit according to claim 1, further comprising a third capacitor between the second power source voltage terminal and the first power source voltage terminal,
wherein the third capacitor is charged through a current pass formed between the second power source voltage terminal and a fourth power source voltage terminal lower in potential than the second power source voltage terminal.

15. The semiconductor circuit according to claim 14, further comprising a first zener diode in the current pass between the second power source voltage terminal and the fourth power source voltage terminal,
wherein the voltage difference between the first power source voltage terminal and the second power source voltage terminal is held at not lower than a specified value.

16. The semiconductor circuit according to claim 14, further comprising a third switching element between the second power source voltage terminal and the fourth power source voltage terminal,
wherein the voltage difference between the first power source voltage terminal and the second power source voltage terminal is held at not lower than a specified value.

17. The semiconductor circuit according to claim 14, wherein the voltage difference between the second power source voltage terminal and the first power source voltage terminal can be controlled.

18. The semiconductor circuit according to claim 17, further comprising a first switch for controlling the voltage increase at the first power source voltage terminal,
wherein the first switch is turned on in the case where the voltage difference between the second power source voltage terminal and the first power source voltage terminal is not lower than the first reference voltage value, and turned off in the case where the voltage difference is not higher than a second reference value lower than the first reference voltage value.

19. The semiconductor circuit according to claim 14, further comprising:
a fourth capacitor between the sixth power source voltage terminal and the output terminals;
a third rectifying element inserted between the first power source voltage terminal and the fourth power source voltage terminal; and
a plurality of second switching elements and a plurality of second controlling circuits for controlling the second switching elements, inserted between the reference voltage terminal and the output terminals,
wherein in the case where the second switching elements are turned on, the fourth capacitor is charged.

20. The semiconductor circuit according to claim 1, wherein the voltage at the output terminals with no current supplied to the load is higher in potential at lest one third of the voltage difference between the high-voltage-side voltage terminals and the reference voltage terminal.

21. The semiconductor circuit according to claim 1, wherein the switching element is formed of a wide band gap semiconductor having a band gap of not smaller than 2.0 eV.

22. The semiconductor circuit according to claim 1, wherein the switching element is a normally-on semiconductor element.

23. The semiconductor circuit according to claim 1, further comprising:

a plurality of first switching elements inserted between the reference voltage terminal and the output terminals;

a plurality of second switching elements inserted between the output terminals and the high-voltage-side voltage terminals;

a sixth capacitor and a fourth rectifying element connected in series between the output terminals and the eighth power source voltage terminal; and a discharge means for charging the sixth capacitor through the fourth rectifying element in the case where the voltage at the output terminals is not higher than a specified voltage, and reducing the voltage across the sixth capacitor before the voltage at the output terminals is reduced to or below the specified voltage after being increased.

24. A semiconductor circuit comprising:

a reference voltage terminal;

a first power source voltage terminal higher in voltage than the reference voltage terminal;

at least a set of output terminals inserted between the reference voltage terminal and the first power source voltage terminal;

a plurality of first switching elements inserted between the output terminals and the first power source voltage;

a plurality of first controlling circuits for controlling the first switching elements, the first controlling circuits operating between the voltage at a plurality of high-voltage-side voltage terminals and the voltage at a plurality of low-voltage-side voltage terminals, the voltage at the low-voltage-side voltage terminals being a negative voltage lower than the source terminal voltage of the first switching elements;

a plurality of first capacitors inserted between the output terminals and a second power source voltage terminal, the voltage of the low-voltage-side voltage terminals being generated by the voltage charged to the first capacitors; and at least a set of second switching elements and a plurality of second controlling circuits for controlling the second switching elements, being inserted between the reference voltage terminal and the output terminals;

wherein the second controlling circuits operate between the voltage at the high-voltage-side voltage terminals and the voltage at a third voltage terminal constituting the voltage at the low-voltage-side voltage terminals;

wherein the voltage at the third voltage terminal is a negative voltage than the voltage at the reference voltage terminal;

wherein the voltage increase of the first power source voltage terminal is controlled by the first switch; and wherein the first switch is turned on in the case where the voltage between the reference voltage terminal and the third power source voltage terminal is not lower than a first reference voltage value, and turned off in the case where the voltage between the reference voltage terminal and the third power source voltage terminal is not higher than a second reference voltage value lower than the first reference voltage value.

25. The semiconductor circuit according to claim 24, wherein the time required for the first switch to turn off from the on state thereof is not longer than one half of the time required for the first switch to turn on completely from the off state thereof.

26. The semiconductor circuit according to claim 24, wherein in the case where the power source voltage of the first controlling circuits is not higher than a specified voltage, the fourth switching element connected to the low-voltage-side voltage terminals of the first controlling circuits is turned on and the current flows from the low-voltage-side voltage terminals of the first controlling circuits to the low-voltage side.

27. The semiconductor circuit according to claim 26, further comprising a fifth switching element connected to the gate terminal of the first switching elements, wherein in the case where the power supply capacity to the first controlling circuits is reduced to or below a reference, the fifth switching element is turned on thereby to reduce the gate voltage of the first switching elements.

28. The semiconductor circuit according to claim 24, further comprising a sixth switching element inserted between the first voltage terminal and the reference voltage terminal, wherein in the case where the power supply capacity to the first controlling circuits is reduced to or below a reference, the current is supplied from the first voltage terminal to the reference voltage terminal.

29. The semiconductor circuit according to claim 24, wherein the voltage at the output terminals with no current supplied to the load is higher in potential by at least one third of the voltage difference between the high-voltage-side voltage terminals and the reference voltage terminal.

30. The semiconductor circuit according to claim 24, wherein selected one of the switching element and the switch is formed of a wide band gap semiconductor having a band gap of not less than 2.0 eV.

31. The semiconductor circuit according to claim 24, wherein the switching element is a normally-on semiconductor element.

32. A semiconductor circuit comprising:

a reference voltage terminal;

a first power source voltage terminal higher in voltage than the reference voltage terminal;

at least a set of output terminals inserted between the reference voltage terminal and the first power source voltage terminal;

a plurality of first switching elements inserted between the output terminals and the first power source voltage terminal;

a plurality of first controlling circuits for controlling the first switching elements, the first controlling circuits operating between the voltage at a plurality of high-voltage-side voltage terminals and the voltage at a plurality of low-voltage-side voltage terminals, the voltage at the low-voltage-side voltage terminals being a negative voltage lower than the voltage at the source terminal of the first switching elements; and a plurality of first capacitors inserted between the output terminals and a second power source voltage terminal;

wherein the voltage of the low-voltage-side voltage terminals is generated by the voltage charged to the first capacitors, wherein the voltage increase at the first power source voltage terminal is controlled by the first switch; and wherein the first switch is turned on in the case where the voltage between the reference voltage terminal and a second power source voltage terminal is not lower than a first reference voltage value and turned off in the case where the voltage between the reference voltage terminal and the second power source voltage terminal is not higher than a second reference voltage value lower than the first reference voltage value.

33. A semiconductor circuit comprising:
a reference voltage terminal;
a first power source voltage terminal higher in voltage than the reference voltage terminal;
at least a set of output terminals inserted between the reference voltage terminal and the first power source voltage terminal;
a plurality of first switching elements inserted between the output terminals and the first power source voltage terminal;
a plurality of first controlling circuits for controlling the first switching elements, the first controlling circuits operating between the voltage at a plurality of high-voltage-side voltage terminals and the voltage at a plurality of low-voltage-side voltage terminals, the voltage at the low-voltage-side voltage terminals being a negative voltage lower than the voltage at the source terminal of the first switching elements; and
a plurality of first capacitors inserted between the output terminals and the second power source voltage terminal;
wherein the voltage of the low-voltage-side voltage terminals is generated by the voltage charged to the first capacitors;
wherein the voltage increase at the first power source voltage terminal is controlled by the first switch; and
wherein the first switch is turned on in the case where the power source voltage of the first controlling circuits is not lower than a first reference voltage and turned off in the case where the power source voltage of the first controlling circuits is not higher than the a second reference value lower than the first reference voltage value.

34. A semiconductor circuit comprising a controlling circuit for a power semiconductor switching element:
wherein the controlling circuit includes a logic controlling circuit unit for generating a logic output corresponding to the on or off state of the power semiconductor switching element, and a switching element connected in series to the logic controlling circuit unit;
wherein in the case where the switching element is turned on, the current is supplied from the power supply of the controlling circuit to the logic controlling circuit and the signal of the logic controlling circuit is transmitted to a gate terminal of the switching element; and
wherein in the case where the switching element is turned off, current from the power supply of the controlling circuit to the logic controlling circuit is stopped, and a unique signal independent of an input signal to the logic controlling circuit is applied to a gate terminal of the power semiconductor switching element.

35. A semiconductor circuit comprising:
a plurality of first switching elements inserted between a reference voltage terminal and a plurality of output terminals;
a plurality of second switching elements between the output terminals and a high-voltage terminal;
a capacitor and a rectifying element connected in series between the output terminals and a power source voltage terminal, the capacitor being charged through the rectifying element in the case where the voltage at the output terminals is not lower a specified voltage; and
a discharge means for reducing the voltage across the capacitor before the voltage at the output terminals reaches a value not lower than a specified voltage after being reduced.

36. The semiconductor circuit according to claim 35,
wherein selected one of the switching element and the switch is formed of a wide band gap semiconductor having a band gap of not lower than 2.0 eV.

37. The semiconductor circuit according to claim 35,
wherein the switching element is a normally-on semiconductor element.

* * * * *